United States Patent
Meynants

(10) Patent No.: US 10,142,575 B2
(45) Date of Patent: Nov. 27, 2018

(54) IN-PIXEL DIFFERENTIAL TRANSCONDUCTANCE AMPLIFIER FOR ADC AND IMAGE SENSOR ARCHITECTURE

(71) Applicant: CMOSIS BVBA, Antwerp (BE)

(72) Inventor: Guy Meynants, Retie (BE)

(73) Assignee: CMOSIS BVBA, Antwerp (BE)

(*) Notice: Subject to any disclaimer, the term of this patent is extended or adjusted under 35 U.S.C. 154(b) by 0 days.

(21) Appl. No.: 15/173,249

(22) Filed: Jun. 3, 2016

(65) Prior Publication Data

US 2016/0360138 A1 Dec. 8, 2016

(30) Foreign Application Priority Data

Jun. 5, 2015 (EP) .................................. 15170898

(51) Int. Cl.
*H04N 5/378* (2011.01)
*H04N 5/3745* (2011.01)
(Continued)

(52) U.S. Cl.
CPC ....... *H04N 5/378* (2013.01); *H01L 27/14609* (2013.01); *H01L 27/14634* (2013.01);
(Continued)

(58) Field of Classification Search
CPC .. H04N 5/378; H04N 5/37455; H04N 5/3575; H01L 27/14609; H01L 27/14634; H01L 27/14636; H01L 27/14643
See application file for complete search history.

(56) References Cited

U.S. PATENT DOCUMENTS 5,877,715 A * 3/1999 Gowda ............... H03M 1/1023
341/118
9,041,581 B2 5/2015 Wolfs
(Continued)

FOREIGN PATENT DOCUMENTS

DE 10006525 A1 1/2002
EP 2 109 306 A2 3/2009
(Continued)

OTHER PUBLICATIONS

Boyd Fowler, "CMOS Area Image Sensors With Pixel Level A/D Conversion," Ph.D. dissertation, Stanford University, Oct. 1995.
(Continued)

*Primary Examiner* — Abdelaaziz Tissire
(74) *Attorney, Agent, or Firm* — Stein IP, LLC

(57) ABSTRACT

An image sensor comprises a first die with an array of pixels and a second die. The first die and second die are stacked together. A first in-pixel part of an analog-to-digital converter (ADC) outputs at least one current signal. The first in-pixel part of the ADC is a Differential Transconductance Amplifier includes a first differential input for receiving the analog signal and a second differential input for receiving a reference signal. There is at least one output bus connected between the first in-pixel part of the ADC on the first die and the second part of the ADC on the second die. The first part of the ADC is adapted to output the at least one current signal to the at least one output bus, and the second part of the ADC is adapted to receive the at least one current signal and to generate a digital signal.

21 Claims, 11 Drawing Sheets

(51) Int. Cl.
*H01L 27/146* (2006.01)
*H03M 1/56* (2006.01)
*H04N 5/357* (2011.01)

(52) U.S. Cl.
CPC .. *H01L 27/14636* (2013.01); *H01L 27/14643* (2013.01); *H03M 1/56* (2013.01); *H04N 5/3575* (2013.01); *H04N 5/37455* (2013.01)

(56) References Cited

U.S. PATENT DOCUMENTS

| | | | | |
|---|---|---|---|---|
| 2005/0072978 | A1* | 4/2005 | Raynor | H04N 3/155 257/75 |
| 2006/0268140 | A1* | 11/2006 | Forbes | H04N 5/3575 348/300 |
| 2009/0101798 | A1* | 4/2009 | Yadid-Pecht | H04N 5/3532 250/208.1 |
| 2009/0256735 | A1* | 10/2009 | Bogaerts | H03M 1/1019 341/169 |
| 2010/0276572 | A1* | 11/2010 | Iwabuchi | H04N 5/2253 250/208.1 |
| 2011/0037868 | A1* | 2/2011 | Ota | H04N 5/357 348/222.1 |
| 2013/0092820 | A1* | 4/2013 | Takemoto | H04N 5/369 250/208.1 |
| 2013/0181316 | A1* | 7/2013 | Tsukimura | H01L 31/02016 257/443 |
| 2013/0314573 | A1* | 11/2013 | Tsukimura | H04N 5/335 348/302 |
| 2013/0321684 | A1* | 12/2013 | Onishi | H04N 5/378 348/302 |
| 2014/0077063 | A1* | 3/2014 | Cho | H01L 27/14618 250/208.1 |
| 2014/0252208 | A1* | 9/2014 | Fujinaka | H04N 5/363 250/208.1 |
| 2014/0361916 | A1* | 12/2014 | Wolfs | H03M 1/185 341/155 |
| 2015/0281614 | A1* | 10/2015 | Yoshida | H04N 5/378 348/308 |
| 2016/0049432 | A1 | 2/2016 | Otaka | |

FOREIGN PATENT DOCUMENTS

| | | |
|---|---|---|
| EP | 2109223 B1 | 4/2013 |
| EP | 2924980 A1 | 9/2015 |
| WO | 2008146236 A1 | 12/2008 |

OTHER PUBLICATIONS

Christer Jansson, et al., "An Addressable 256×256 Photodiode Image Sensor Array with an 8-Bit Digital Output," Analog Integrated Circuits and SignalProcessing 4, 37-49 (1993), Kluwer.

Extended European Search Report dated Dec. 23, 2015 from European Patent Application 15170898.9 filed Jun. 5, 2015.

Guy Meynants, et al., "Limitations to the frame rate of high speed image sensors," Proc. International Image Sensor Workshop, Jun. 2009, Bergen.

J. Bogaerts, et al.,"High Speed 36 Gbps 12Mpixel global pipelined shutter CMOS image sensor with CDS," Proceedings of IISW, 2011.

Shunichi Sukegawa, et al., "A 1/4-inch 8Mpixel Back-Illuminated Stacked CMOS Image Sensor," Proc. ISSCC 2013, pp. 484-485.

Yue Chen, et al., "A 0.7e-rms Temporal-Readout-Noise CMOS Image Sensor for Low-Light-Level Imaging," International Solid-State Circuits Conference (ISSCC), San Francisco, Digest Tech. Papers, pp. 384-385, Feb. 19-23, 2012.

Jun Aoki et al., "A Rolling-Shutter Distortion-Free 3D Stacked Image Sensor with -160dB Parasitic Light Sensitivity In-Pixel Storage Node", Feb. 20, 2013, pp. 482-483.

* cited by examiner

US 10,142,575 B2

IN-PIXEL DIFFERENTIAL TRANSCONDUCTANCE AMPLIFIER FOR ADC AND IMAGE SENSOR ARCHITECTURE

CROSS-REFERENCE TO RELATED APPLICATIONS

This application claims the benefit of, and hereby incorporates by reference the contents of, European Patent Application No. 15170898.9, filed on Jun. 5, 2015.

BACKGROUND

A CMOS Image Sensor (or CIS) architecture is shown in FIG. 1 and can contain a pixel array, surrounded by control logic 100 and a column readout circuit formed by a column readout stage 106 and an output stage 107. The column readout circuit can contain a column-wise programmable gain amplifier (or PGA) and a column-wise analog-to-digital converter (or ADC). The output stage 107 can contain a digital multiplexer and output drivers. Data is output over one or multiple serial output channels. The frame rate of an image sensor is an important parameter. Developments for faster frame rates are needed, required for imaging of fast moving and ultra-short events for scientific and industrial applications. Several measures have been taken to further increase frame rate. A first improvement is by a faster column analog-to-digital (AD or A/D) conversion and faster readout circuits. A fundamental limitation to the speed of an image sensor architecture as shown in FIG. 1 is set by the pixel array. The planar pixel array is composed of row control lines and column output busses. Column busses run over the entire height of the pixel array. For large focal plane arrays, the capacitance of such column output bus can be large (several pF). To sample a pixel signal, the column bus needs to be sampled after settling. With a large column capacitance this can take a considerable amount of time and limit the maximum frame rate with which the sensor can be read out. This is discussed, for example, in "Limitations to the frame rate of high speed image sensors," G. Meynants, et al., Proc. International Image Sensor Workshop, June 2009, Bergen (available on www.imagesensors.org), which is hereby incorporated by reference.

Solutions have been proposed by reducing the capacitance of the output line. One possible solution is the use of in-pixel AD conversion (see, e.g., "CMOS area image sensors with pixel level A/D conversion", Boyd Fowler, Ph.D. dissertation, Stanford University, October 1995, which is hereby incorporated by reference). CMOS area image sensor is known with pixel-level analog-to-digital conversion. The A/D conversion is performed using a one-bit first-order sigma delta modulator at each pixel. Such in-pixel ADC avoids a long interconnect between the pixel buffer amplifier and the AD converter. However, this requires a considerable amount of extra circuitry to be put in the pixel, which limits the minimum pixel size that can be realized. Also power dissipation may increase due to this massive parallel circuitry that is active at the same moment in time.

In an image sensor as shown in FIG. 1, the row readout time needs to be decreased to increase frame rate. Part of the row readout time contains the sampling of the signals on the column busses when a row of pixels is selected, commonly referred to as Row Overhead Time or ROT. This ROT is limited by the time needed for accurate settling of the pixel column bus. Only after column settling, the signal of each pixel can be further amplified and AD converted in the column. A known method is pipelining of the pixel sampling process, the amplification process and the AD conversion process by multiple intermediate sampling stages. This is for example described in J. Bogaerts, et al., "High Speed 36 Gbps 12Mpixel global pipelined shutter CMOS image sensor with CDS", Proc. IISW 2011 (available on www.imagesensors.org), which is hereby incorporated by reference. In this case, the frame rate is determined by the slowest of the pixel sampling, amplification and AD conversion processes. This requires additional sample-and-hold stages in the column amplifier structure, which may be difficult to make and area consuming for small column pitches. In addition, in large arrays, the pixel sampling process can be slowed down due to the large capacitive loads of the pixel column bus.

By means of example, FIG. 2A shows a known column ADC architecture for a typical CMOS image sensor and FIG. 2B a timing chart. The pixel contains a selection switch driven by a control signal "sel." When activated, the row of pixels is selected and the signal of the pixel sense node it put on the column bus. In this example, this is the signal directly from the photodiode (in a "3T pixel" architecture), but this can also be the voltage of an in-pixel sample stage, or the floating diffusion sense node of a classical "4T" active pixel with in-pixel charge transfer. The signal of the column bus is sampled in the column amplifier in a sample-and-hold stage, controlled by a "sample" signal. In principle, a programmable gain amplifier could be present in the column structure before or after this sampling stage but this is not shown in the figure. The signal can be sampled after settling on the column bus. The sampled signal can then be converted into a digital value by the column AD circuit shown. This circuit contains a comparator, a counter and an SRAM buffer. The counter is reset at the start of the AD conversion process. The signal of the sample-and-hold stage is applied to the comparator. A sloped ramp signal is applied at the other input of the comparator. The output of the comparator enables or disables a counter depending on the output of the comparison. After the start of the ramp, the counter is clocked and enabled until the ramp signal crosses the signal stored in the column sample-and-hold stage. At the end of the conversion cycle, the counter contains a digital value representative of the signal of the pixel. The structure shown is simplified. Several variants have been proposed in the past with multiple counters (see, e.g., U.S. Pat. No. 9,041,581 to Wolfs, entitled "Analog-to-Digital Conversion" and issued May 26, 2015, which is hereby incorporated by reference) or with dual ramp conversion cycles to allow correlated double sampling (see, e.g., European Patent Publication No. EP2109223 by Bogaerts, entitled "Analog-to-digital conversion in pixel arrays" and filed Feb. 19, 2009, which is hereby incorporated by reference). Other implementations use a latch instead of a counter. When the comparator toggles, the latch latches a digital value that is distributed to the column structures and that is representative of the moment in time when the comparator toggled. This is for example described in C. Jansson, et al, "An Addressable 256×256 Photodiode Image Sensor Array with an 8-bit Digital Output," Analog Integrated Circuits and Signal Processing 4, 37-49 (1993), Kluwer, which is hereby incorporated by reference. In all cases, there is a settling time between the selection of the pixel and the moment when the signal present on the column can be sampled, which is determined by the capacitance of the column bus (Cbus), the dimensions of the pixel source follower, and the bias current through this source follower.

A further design is known from Yue Chen, Yang Xu, Youngcheol Chae, Adri Mierop, Xinyang Wang, Albert Theuwissen, "A 0.7 e-rms Temporal Readout Noise CMOS Image Sensor for Low-Light-Level Imaging," International Solid-State Circuits Conference (ISSCC), San Francisco, Digest Tech. Papers, pp. 384-385, Feb. 19-23, 2012, which is hereby incorporated by reference.

SUMMARY

It is an object of the present invention to provide an alternative image sensor, for example an alternative CMOS Image Sensor (or CIS) architecture and in particular to provide an alternative ADC architecture and yet more particularly to provide an alternative pixel structure and/or alternative pixel array and to provide an alternative integrated circuit including the pixel array. Embodiments of the present invention relate to an image sensor with pixels, especially a CMOS image sensor, including a pixel structure, a pixel array, an integrated circuit including the pixel array, row logic and column readout circuits and cameras including any of these.

The present invention provides an ADC structure for an image sensor having an array of pixels in rows and columns, the ADC structure having an in-pixel transconductance differential amplifier adapted for supplying a current output to a column-wise AD current-sensing comparator.

In one aspect the present invention provides an image sensor comprising: a first die with an array of pixels. Each pixel of the pixel array has a pixel structure comprising: a photosensitive device for sensing incident light and for outputting an analog signal; a first node for receiving the analog signal; and a first in-pixel part of an analog-to-digital converter, ADC, for outputting at least one current signal. The first in-pixel part of the ADC is a Differential Transconductance Amplifier with a first differential input connected to the first node for receiving the analog signal present on the first node, and a second differential input for receiving a reference signal. The image sensor comprises a second die with a second part of the ADC, wherein the first die and the second die are stacked together. The image sensor comprises at least one output bus connected between the first in-pixel part of the ADC on the first die and the second part of the ADC on the second die, wherein the first part of the ADC is adapted to output the at least one current signal to the at least one output bus and the second part of the ADC is adapted to receive the at least one current signal and to generate a digital signal being an analog-to-digital conversion of the analog signal.

The reference signal can be a ramp signal. The reference signal can be generated in-pixel or outside the pixel, e.g., from an output of the second part of the ADC, as in successive approximation register (SAR) ADC and some other topologies for example as adapted with the novel feature of an ADC structure having an in-pixel transconductance differential amplifier adapted for supplying a current output to a column-wise AD current-sensing comparator.

The first or the second signal is a photosignal, e.g., on a floating diffusion node or from a photosensitive device such as a photodiode or on an in-pixel sample stage. The second analog signal can be same as the first analog signal.

The Differential Transconductance Amplifier may be a Full Differential Transconductance Amplifier having a first differential input for receiving the second analog signal present on the in-pixel node such as the charge storage node or sense node or in-pixel sample stage, and a second differential input for receiving a reference signal, and also having a first and a second current electrode for outputting first and second current signals, respectively.

The photosensitive device can be a photodiode, for example, such as a pinned photodiode with a p+ surface layer, an n-type well under the p+ surface layer in a p-type substrate. The diode depletion region does not touch the surface; it is buried inside the semiconductor such as silicon.

The photosensitive device can be a photogate or a buried channel photogate, for example.

An advantage of embodiments of the present invention is that they act as a current-mode readout rather than in voltage mode which increases speed. A further advantage is the increase in readout speed by stacking a first die having the pixel array including pixels with an in-pixel differential transconductance amplifier which can be implemented efficiently as a differential transistor pair and the readout being on another die, with both dies being stacked together with wafer-to-wafer stacking or die-to-die bonding. A further advantage of embodiments is that embodiments use a Ramp-Compare ADC, which is efficient as far as floor space in the pixel is concerned.

An advantage of embodiments of the present invention is that they do not suffer from leakage. Leakage can cause a non-linearity in the response, and this can vary from pixel to pixel, so that there are then more pixel-to-pixel gain differences.

Avoiding having the whole comparator fully in the pixel has the advantage that PMOS transistors can be located outside the pixel. This avoids the N-wells of PMOS transistors competing with the photodiode for collection of photocharges. Such an arrangement would drastically reduce the sensitivity which reduction is avoided with embodiments of the present invention.

Furthermore, as embodiments of the present invention use one or two current outputs of the differential transconductance amplifier, e.g., the one or two drain outputs of a differential transistor pair, the readout can be fast. For example, embodiments of the present invention include a differential transconductance amplifier, e.g., configured as a differential transistor pair inside the pixel, wherein a drain is connected to a column bus or the drain outputs are both connected to column busses (either directly or indirectly via selection switches—see FIG. 5). One of the control electrodes (e.g., gate of one of the differential transistor pair) of the differential transconductance amplifier is connected to an ADC reference, e.g., a ramp or a SAR DAC output signal or similar and the other input is connected to a photosignal (e.g., on a floating diffusion or photodiode or a sense node or an in-pixel sample stage).

The differential transconductance amplifier (whether full or not) has a bias source connected to its other current electrode. The bias source (e.g., bias transistor) sets the bias current $I_{bias}$ and the two transistors of the differential pair or the two transconductance paths of the differential transconductance amplifier compete for a fraction of this current. The Full Differential Transconductance Amplifier current outputs (e.g., the Differential Transistor Pair current outputs) toggle between negative and positive or vice versa which is used to stop the counter. A current sensing circuit, such as a resistor and an amplifier are present in the column structure and act as a circuit to detect the crossing point of the current output from the Differential Transconductance Amplifier. Other implementations for the current sensing circuit could be based upon resistors only and are included within the scope of the present invention. Other implementations could be based upon capacitors and amplifiers or upon amplifiers or other comparator circuits.

Embodiments of the present invention make use of a single-slope ADC. Embodiments of the present invention can use a "dual slope ADC" or a multi-slope ADC with multiple conversions to reduce noise. Any of the embodiments can be augmented in this way.

Generally only a single reference voltage such as a single reference ramp voltage needs to be used with any of the embodiments of the present invention. In embodiments of the present invention, a part of the ADC is in-pixel and a part is not in-pixel. The photosensitive device such as a photodiode is in-pixel as well as some transistors for charge transfer and capacitors to hold charge. The reference signal generator such as the ramp generator will generally not be in-pixel. The bias source of the Differential Transconductance Amplifier can be inside the pixel but it is within the scope of the present invention that the bias source is outside the pixel on an extra column line.

Embodiments of the present invention can use a one-step or two-step ADC. Embodiments of the present invention can be used with either or both. In a two-step ADC, there is a conversion of the reset level and then the signal level to perform correlated double sampling (CDS).

Embodiments of the present invention can use an ADC which divides an n-bit AD conversion into p-bit coarse and q-bit fine conversions where n is the sum of p and q can be done by two current sensing circuits, e.g., including different current sense amplifiers in the column lines.

The second part of the ADC, which is not in-pixel, can include (in addition for example to a current sensing circuit) a counter or a latch or SAR logic plus a digital-to-analog converter (DAC). The parts of the ADC are split sequentially from a processing point of view so that the first part does the comparison with a reference signal such as a ramp signal and the second part does the generation of the digital value, e.g., by timing or counting or by assuming the digital value from a DAC. The digital value can be stored or buffered in a local memory such as an SRAM before being output through a multiplexer.

Another aspect of the present invention is a method of operating an image sensor comprising a first die with an array of pixels, each pixel of the pixel array having a pixel structure comprising a photosensitive device, a first in-pixel part of an analog-to-digital converter, ADC, the image sensor also comprising a second die with a second part of the ADC, wherein the first die and the second die are stacked together, the method comprising, at the first die: sensing incident light at the photosensitive device and outputting an analog signal; comparing, using the first in-pixel part of the ADC, the analog signal with a reference signal and outputting at least one current signal to the at least one output bus, wherein the first in-pixel part of the ADC is a Differential Transconductance Amplifier; and the method comprising, at the second die: receiving the at least one current signal and completing ADC conversion.

The method can include preparing an initial ramp voltage of a reference ramp unit for a next AD conversion cycle on a next row to be converted in-pixel while an AD conversion runs on the row that is being read out.

The initial ramp voltage can start immediately once the row readout starts.

The initial ramp voltage for a next row or rows can be started already before the AD conversion of the previous row is fully finished.

The initial ramp voltage can be reset to an initial value after each row conversion.

The image sensor can comprise a generator for generating pixel control signals for charge transfer, reset, selection, bias current and a ramp signal.

The image sensor can have a row driver for the pixel array, wherein at least one of the pixel control signals is generated in the row driver.

The image sensor can have a column sense amplifier, in which case signals on a column bus are sensed by the column sense amplifier and AD converted by a counter connected to a column bus.

The image sensor can have a memory for buffering a converted digital value in each column of the pixel array.

The image sensor can have a digital multiplexer adapted so that data from the memory is multiplexed with the digital multiplexer to the outputs.

Embodiments of the present invention can be implemented as an integrated circuit comprising a pixel array or any of the embodiments of the present invention whereby each pixel of the array can have a pixel structure of any of the embodiments of the present invention.

Embodiments of the present invention can be implemented as an ADC structure for an image sensor having an array of pixels in rows and columns, the ADC structure having an in-pixel differential transconductance amplifier supplying a current output to a column-wise AD current-sensing comparator.

The ADC structure can be a successive approximation ADC, the in-pixel differential transconductance amplifier being adapted for comparing a signal from an in-pixel photosensitive device with an output of an internal digital-to-analog converter (DAC) which represents a value of a selected voltage range.

The ADC can be adapted such that at each iterative step, an approximation to an analog-to-digital conversion value is stored in a SAR.

The ADC can be adapted so that a feedback signal is returned to the differential transconductance amplifier over a vertical (column line) line, or it can be part of a 2-die stacked imager with interconnects inside the pixel array.

The ADC structure can provide an input signal of the in-pixel differential transconductance amplifier which is a reference ramp signal and the analog-to-digital conversion (ADC) is adapted to process parallel ramp cycles by using different ramp voltages to cover different ranges of the analog-to-digital conversion (ADC).

An advantage of embodiments of the present invention can be the avoidance of long settling times. An advantage of embodiments of the present invention can be to save area required for column sample-and-hold stages. An advantage of embodiments of the present invention can be to increase the frame rate, e.g., while avoiding the problems described above of increased device area and slow column settling times.

BRIEF DESCRIPTION OF THE DRAWINGS

Objects, features, and advantages of the disclosure will be readily apparent from the following description of certain embodiments taken in conjunction with the accompanying drawings in which.

DETAILED DESCRIPTION

Figure 1:
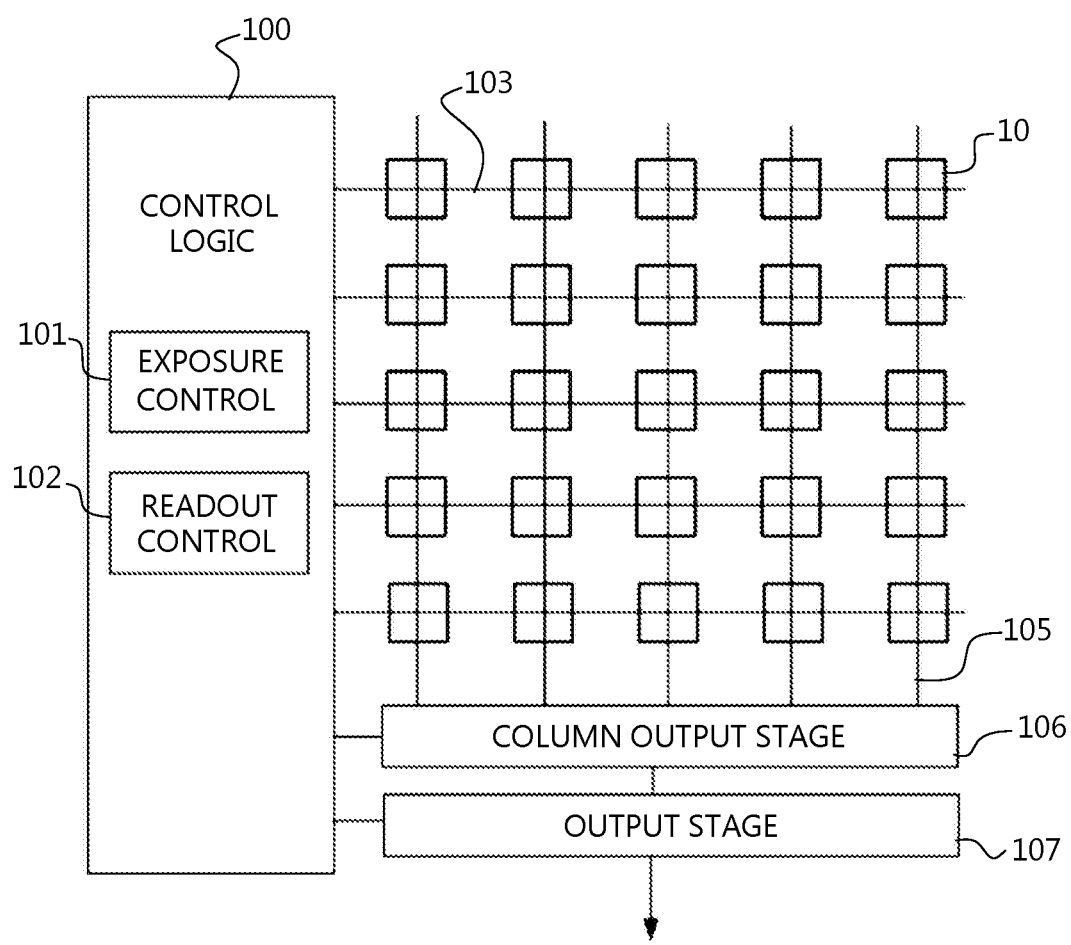
FIG. 1 shows the architecture of a known CMOS image sensor, including a pixel array, row logic and column readout circuits

Certain terminology used herein is now set forth. A "Differential Transconductance Amplifier" is an amplifier that converts a voltage input to a current output and is also known as a voltage controlled current source. Everywhere in the description and claims where the words "Transconductance Amplifier" appear, they can be replaced by "voltage controlled current source." In embodiments of the present invention a differential transconductance amplifier is used to control the output current or currents of the differential transconductance amplifier in dependence on a comparison between a pixel signal and a reference voltage, e.g., a reference ramp voltage applied to the inputs.

A "Full Differential Transconductance Amplifier" is also a voltage controlled current source which has two differential voltage inputs and two differential current outputs. A Single Ended Differential Transconductance Amplifier has two differential inputs and a single current output, whereby the current output depends upon a comparison between a first signal such as a pixel photosignal and a second signal such as a reference voltage, e.g., a reference ramp voltage applied to the inputs.

A "pixel" is the smallest photosensitive controllable element of an imager. To be useful a plurality of pixels are arranged in an array having columns and rows or pixels.

A "pixel structure" refers to components that work together to form the pixel. Such a structure can communicate with other components outside the pixel.

An "ADC structure" refers to the components that, in combination, work together to convert an analog signal to a digital signal.

The term "die" refers to any of a chip or microchip or an integrated circuit.

The present invention relates to an image sensor with pixels, especially a CMOS image sensor, including a pixel structure, a pixel array, an integrated circuit including the pixel array, memory, row logic and column readout circuits. To avoid long settling times, and to save area required for column sample-and-hold stages, an ADC architecture is presented as an embodiment of the present invention.

Embodiments of the present invention relate to a pixel structure, for example, that contains a part or parts of an ADC in-pixel, for example any or some of a differential transconductance amplifier as a first stage of a comparator, a reference voltage unit such as a ramp voltage unit, sample and hold circuits, select switches, a bias current source.

The present invention provides an ADC architecture in which one or more pixels have at least a part of an ADC in-pixel, namely a Differential Transconductance Amplifier which outputs a current signal to a current sensing circuit in the column logic which is not in-pixel.

Embodiments of the present invention make use of a ramp-compare ADC whereby the ADC is split between one part in-pixel and one part not in-pixel. In any of the embodiments of the present invention a ramp ADC can be used with a counter or without a counter but instead distribute a timestamp, which is latched in a register at the appropriate moment in time.

For example, embodiments of the present invention can make use of an ADC circuit having a counter that starts counting at the start of the conversion. The counter stops when the means for sensing current in a column circuit determines that the current on the column lines has toggled. In some embodiments the counter output drives a digital-to-analog converter (DAC) that generates the reference ramp signal, and the counter output is also distributed to the column latches of the column ADC. When the comparator, i.e., when the Differential Transconductance Amplifier toggles, this count value is converted.

One type of ADC is known as a ramp-compare ADC. A ramp-compare ADC has a saw-tooth signal as a first input to a comparator. The ramp signal ramps up or down then quickly returns to zero. When the ramp starts, a counter starts counting (i.e., a counter or a timer). When the ramp voltage is the same value as the second signal input to the comparator, i.e., the signal from the photosensitive device in the pixel, the comparator fires, and the counter's value is recorded. In embodiments of the present invention, a part of the comparator is an in-pixel Differential Transconductance Amplifier, which outputs one or more current signals to a means for sensing the current in a column circuit. To be sure the comparator (i.e., the in-pixel Differential Transconductance Amplifier) toggles at the correct value, the ramp can be calibrated against a standard. Alternatively a clocked counter can, for example, be used which drives a DAC and then the comparator is used to preserve the counter's value, e.g., in a memory or buffer in a column circuit. A special advantage of the ramp-compare system is that comparing with yet another input signal only requires another comparator (i.e., another in-pixel Differential Transconductance Amplifier), and another register (buffer, memory) to store the voltage value.

In embodiments of the present invention making use of a ramp-compare type ADC, the ADC is partly in-pixel and partly outside the pixel. Assuming the pixel is part of a pixel array, e.g., on a microchip, then the part outside the pixel can also be outside the microchip on which a pixel array is located. In particular, the part outside the pixel or outside the microchip can be part of the column readout logic, including means for sensing current.

In embodiments of the present invention the comparator includes an in-pixel differential transconductance amplifier, which has the reference signal such as a ramp signal and pixel photosignal as inputs. The counter and the rest of the comparator are off pixel.

In embodiments of the present invention one input, e.g., the reference voltage such as the ramp voltage, of the differential transconductance amplifier is shared amongst the different columns or rows of a pixel array, and this is the reference input of the differential transconductance amplifier. For example, this reference or ramp signal can be an input of the differential transconductance amplifier and can be common for a row of pixels. For example, the differential transconductance amplifiers of different pixels can share the same ramp signal value for all the columns.

The off-pixel building blocks of an ADC according to embodiments of the present invention include a counter or a latch or SAR logic plus a DAC. In one aspect of the present invention a part of the ADC being a counter or a latch or SAR logic plus a DAC is not in-pixel and another part of the ADC comprising a differential transconductance amplifier is in-pixel. The counter or a latch or SAR logic plus a DAC may be located in a column circuit which is connected to an output bus and hence does not need to be on the chip where the pixel or pixel array is located. This reduces the number of extra transistors required in-pixel. In a pixel array another advantage of embodiments of the present invention is that the reference voltage such as a ramp voltage can be prepared in a next row or rows of pixels while the pixel values of the current row are being converted. This reduces delays while requiring only a modest increase in the number of transistors in each pixel.

Figure 3:
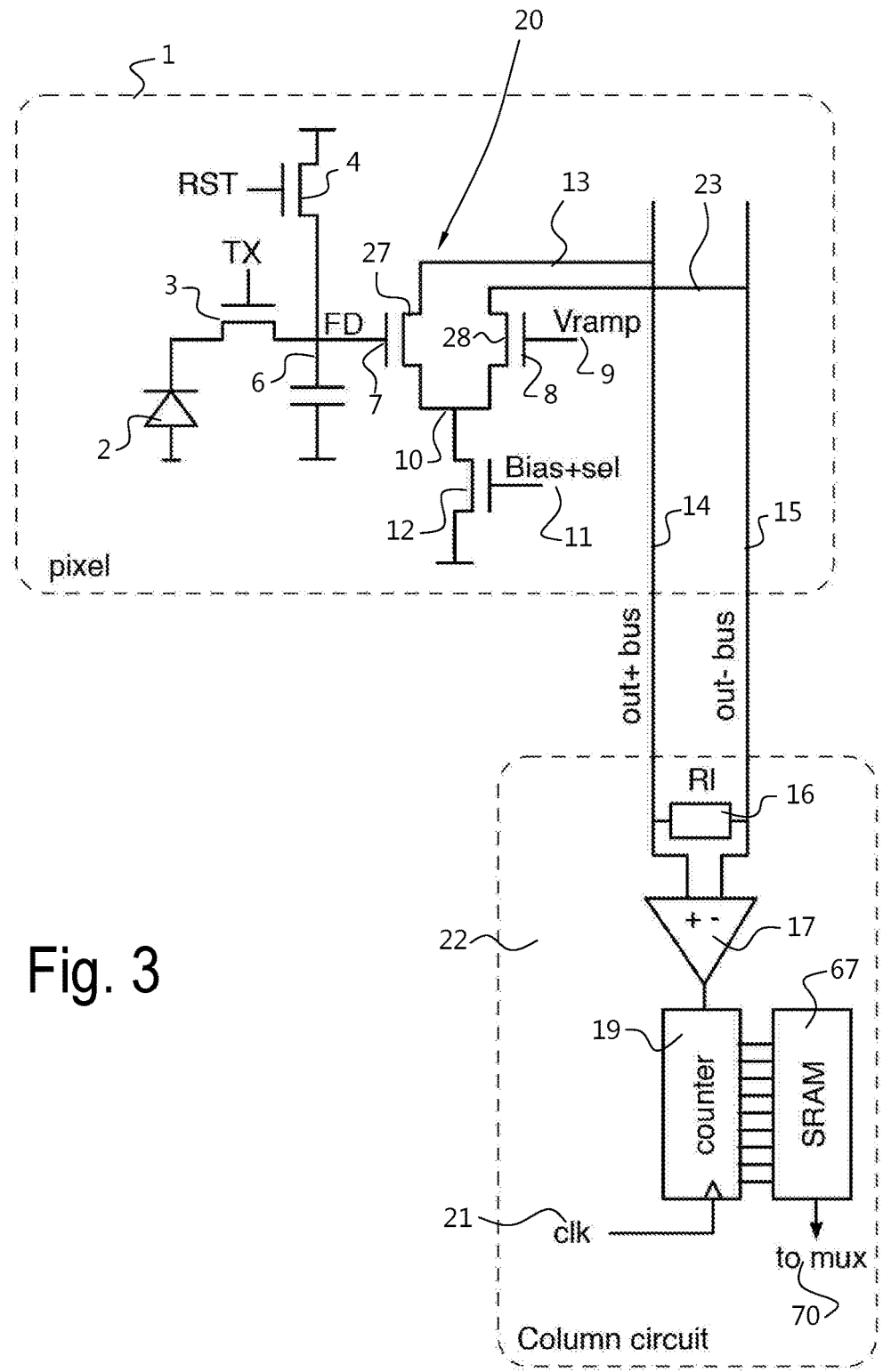
FIG. 3 shows the architecture of an ADC architecture, with an in-pixel differential amplifier, and column-wise AD current comparator and counter coupled to a rolling shutter pixel architecture in accordance with an embodiment of the present invention.
Figure 4:
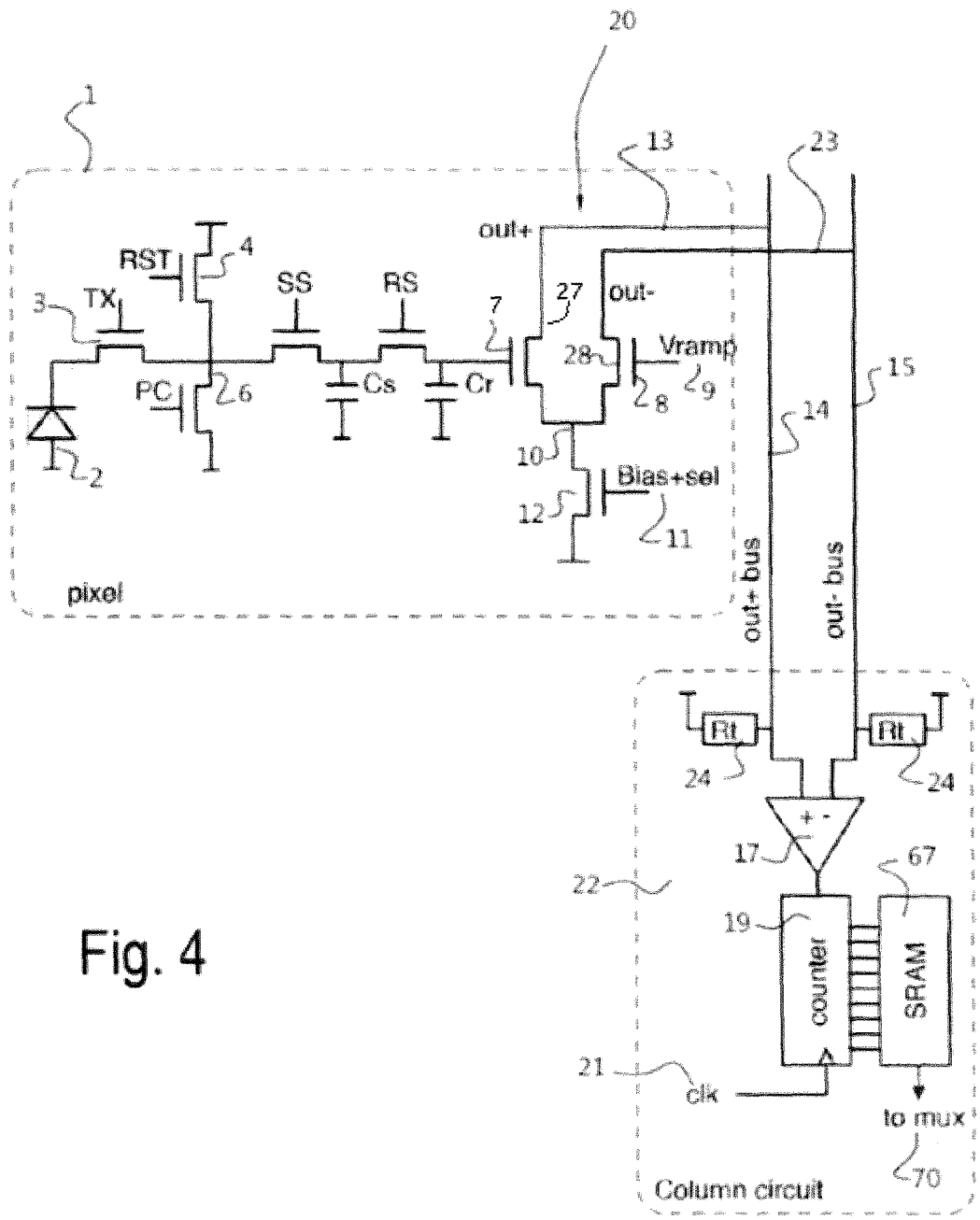
FIG. 4 shows an ADC architecture, with an in-pixel differential amplifier, coupled to a global shutter pixel architecture with in-pixel sampling stage in accordance with a further embodiment of the present invention.

A first architecture and structure of embodiments of the present invention will be described with reference to FIGS. 3 to 7 and 9 to 12 and can be used with the pixel array stack in an image sensor shown in FIG. 8. All of these embodiments disclose a pixel structure 1 which comprises a photosensitive element such as a photodiode 2 and a first node such as a charge storage node or sense node or a sample stage node 6. Node 6 can be, for example, a floating diffusion (FD) sense node such as an FD sense node in 4T pixel, a sample stage in global shutter pixel, or a photodiode in 3T pixel, etc. A reset switch or transistor 4 and a charge transfer switch or transistor 3 are provided in-pixel. A single stage or multistage differential transconductance amplifier 20 has a first differential input 7 connected to the first node, e.g., charge storage or sense node 6—see FIGS. 3, 5, 7 and 9-12. Alternatively the first differential input 7 of the differential transconductance amplifier 20 is connected to a sample stage of the pixel as shown in FIGS. 4 and 6. A reference signal such as a reference ramp input 9 is connected to the other differential input 8 of the differential transconductance amplifier 20—see FIGS. 3-7, 9, 11, and 12. This reference signal can be generated in-pixel or not—see, for example, the reference signal in FIG. 10, which is from outside the pixel.

Figure 11A:
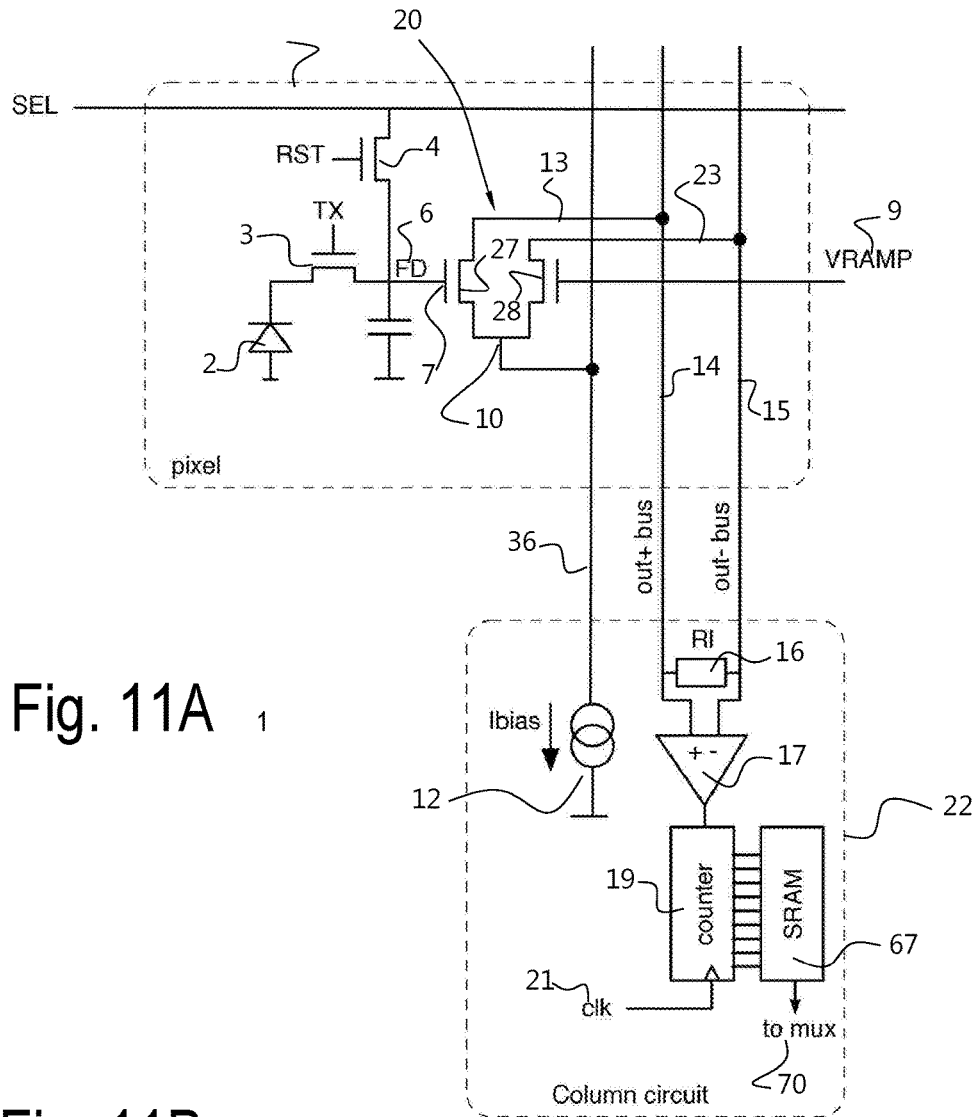
FIG. 11A shows a schematic timing diagram for an alternative embodiment where the bias current source is placed in the column circuitry, with a different method of selecting the pixels and correlated double sampling operation by dual AD conversion cycles.

A bias current source 12 is connected to a power electrode 10 of the differential transconductance amplifier 20 controlled by a signal 11 applied to the control electrode of the bias current source 12, e.g., a gate of a transistor. This bias current source 12 can be on-pixel or off-pixel as shown in FIG. 11A.

Figure 5:
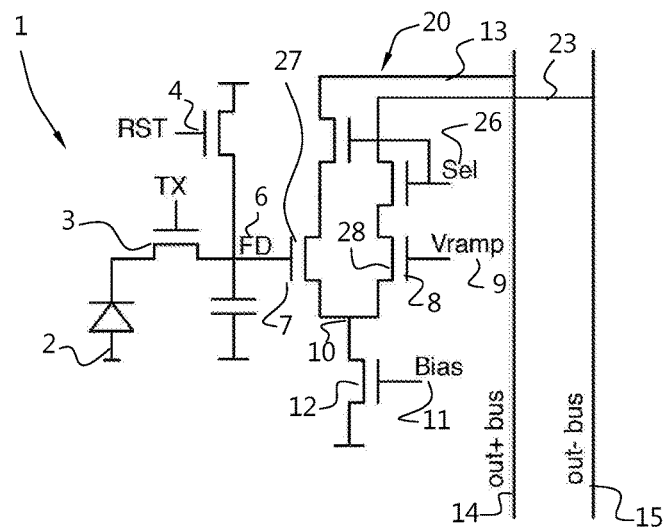
FIG. 5 shows a pixel structure with an in-pixel differential amplifier and with separate selection switches in accordance with a further embodiment of the present invention.
Figure 6:
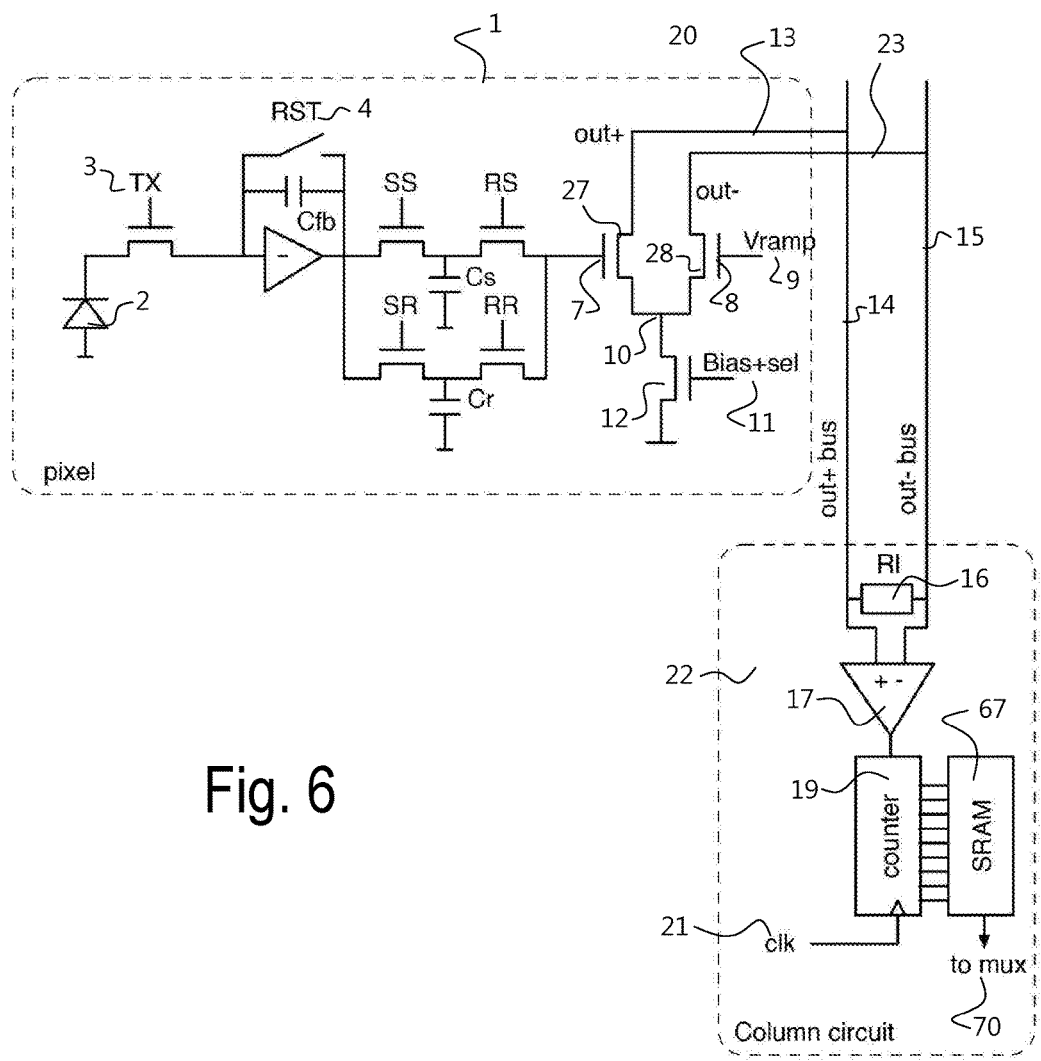
FIG. 6 shows an ADC architecture, with an in-pixel differential amplifier, coupled to a global shutter pixel architecture with in-pixel sampling stage and an in-pixel charge sense amplifier in accordance with a further embodiment of the present invention.

The differential transconductance amplifier 20 can be a full differential transconductance amplifier 20 with two current outputs 13, 23—see FIGS. 3-6, 10, 12, for example—or as a single-ended differential transconductance amplifier 20 as shown in FIG. 5.

Figure 7A:
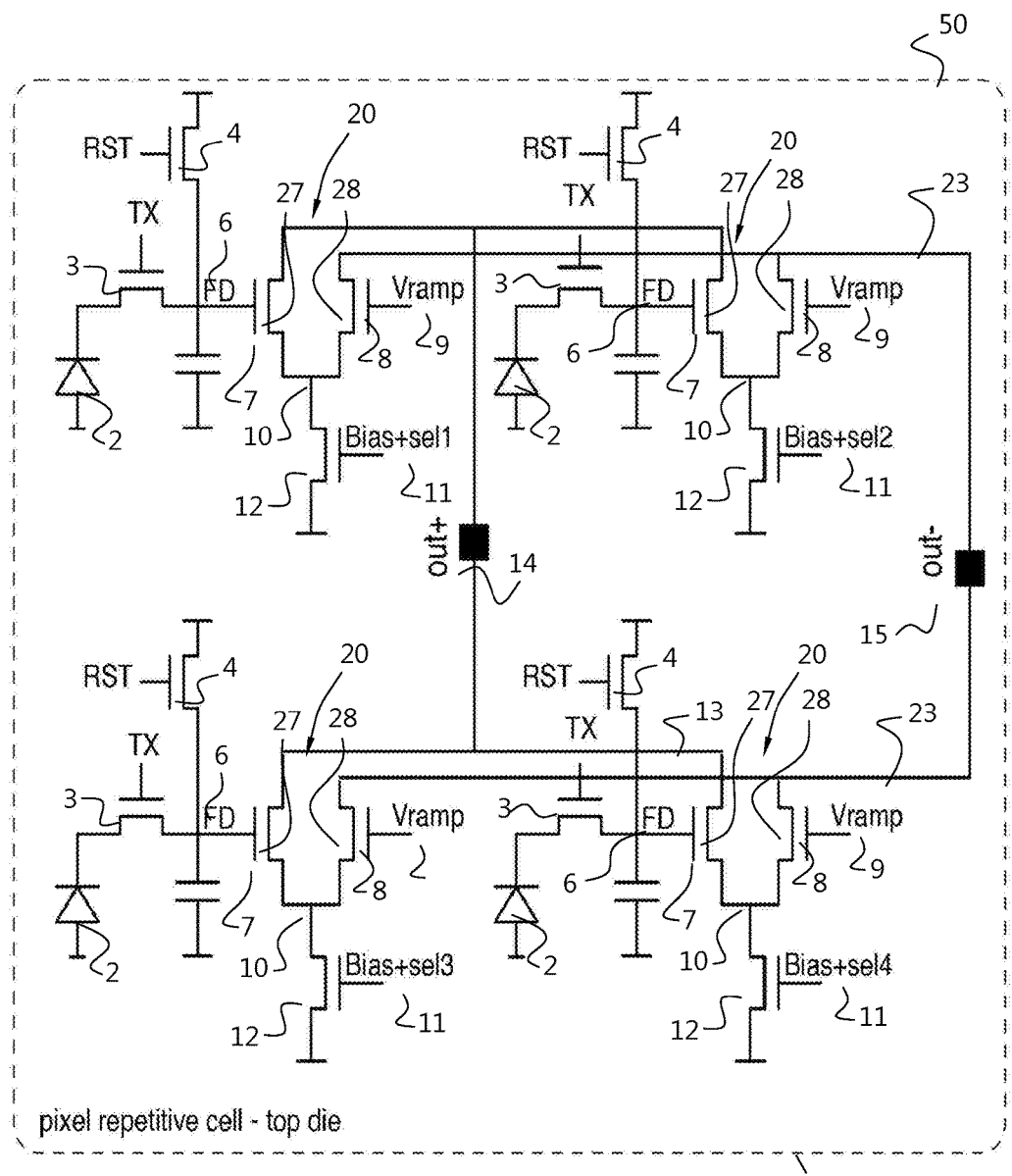
FIGS. 7A and 7B show an ADC architecture, with an in-pixel differential amplifier, where the pixel outputs from a first die connect to a second die using die stacking technology in accordance with an embodiment of the present invention.
Figure 7B:
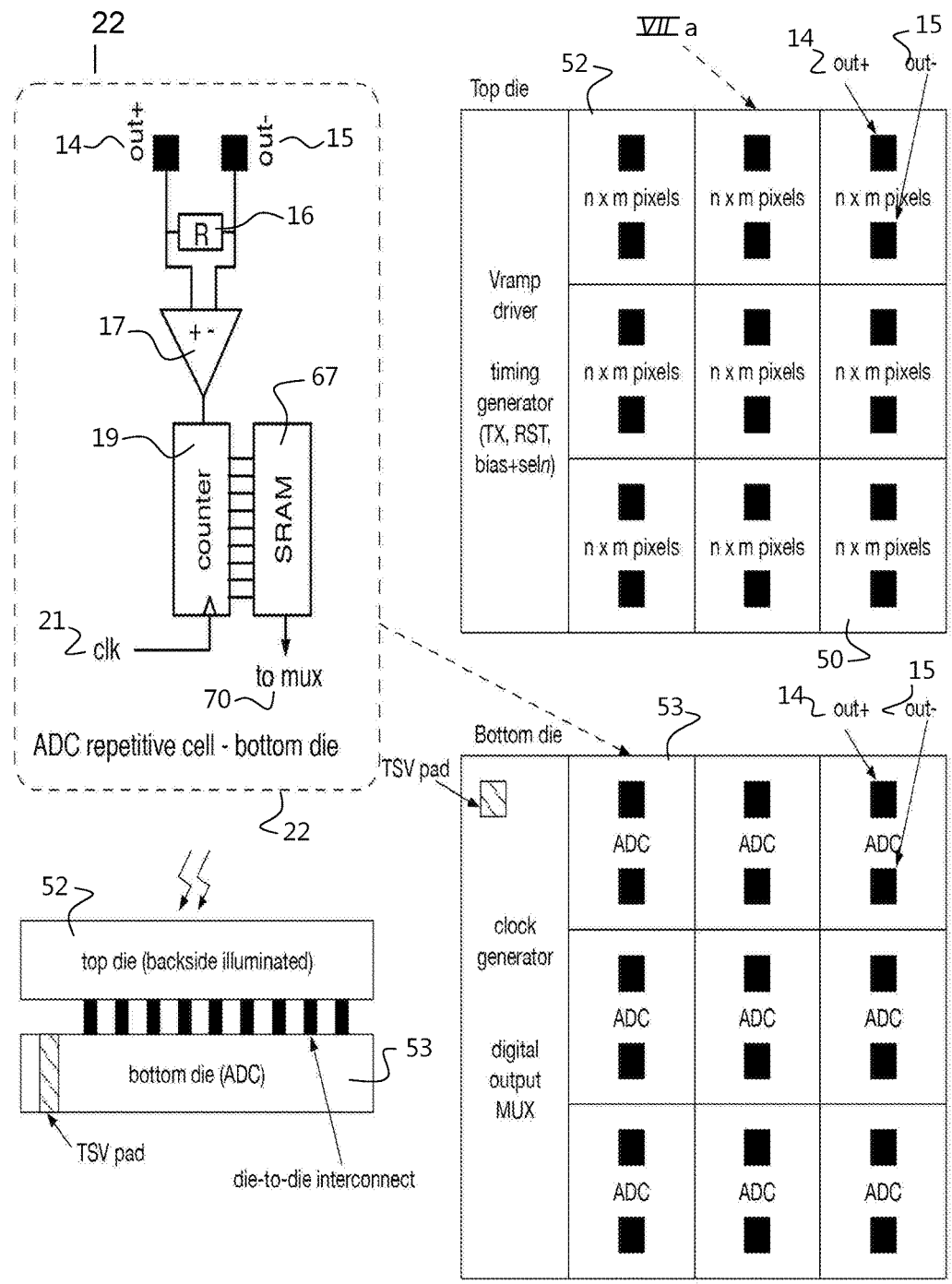
Figure 8:
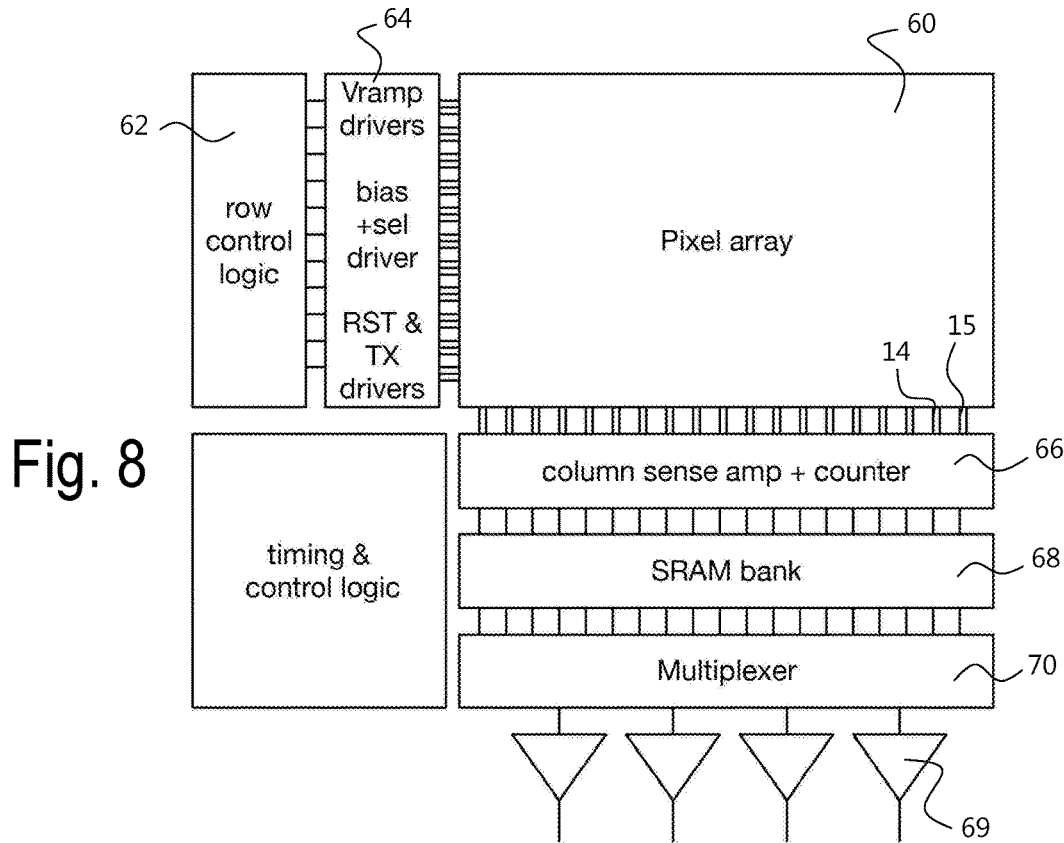
FIG. 8 shows an architecture of an image sensor using an ADC architecture in accordance with an embodiment of the present invention.

The differential transconductance amplifier 20 can be implemented as a transistor pair 27, 28—see FIGS. 3 to 7, and 9-12—which can also be used in the imager of FIG. 8. In embodiments of the present invention shown in FIGS. 3 to 7 and 9 to 12, at least one of the differential outputs 13, 23 of the differential transconductance amplifier 20 is connected to at least one output bus or column line 14, 15. The use of a current output rather than a voltage output for the pixel increases speed of operation. A voltage output is slower due to the need to charge up the capacitance associated with the column busses, whereby this capacitance increases with the size of the pixel array.

Specific embodiments of the present invention are shown in FIGS. 3-5, 7 and 9-12 and comprise a first transistor 27 with its control electrode, e.g., gate 7 coupled to the first node such as a sense node 6 and hence receiving an analog signal therefrom, a reference signal such as a reference ramp input 9, a second transistor 28 with its control electrode, e.g., a gate 8, coupled to this reference signal, e.g., reference ramp input 9, a common first power electrode, e.g., a common source 10 of the first and second transistors 27, 28 being connected to a bias current source 12 and a second power electrode, e.g., drain 13, 23 of the first or second transistor 27, 28 is coupled to an output bus 14, 15.

The bias current source 12 (e.g., a transistor) sets the bias current $I_{bias}$ (determined by the signal 11) and the two transistors 27, 28 of the differential pair compete for a fraction of this current whereby the amount of current they output depends on the comparison of the signal on node 6 and the reference voltage 9. The current outputs will toggle between plus and minus or vice versa as the predominance of one of the two input voltages changes when the other voltage begins to dominate. The current outputs from the differential transistor pair 27, 28 are fed to the column busses 14 and 15 and to a column circuit 22, which includes a current sensing circuit (of which one example is a resistor 16 and an amplifier 17, see FIGS. 3, 6, 7, 9 to 12, or two resistors 24 and amplifier 17, see FIG. 4) or any other equivalent circuit.

In accordance with embodiments of the present invention the output stage of an Image Sensor chip is a pixel that is composed of a part of an ADC, namely a differential transconductance amplifier 20 exemplified by a differential transistor pair of two transistors 27, 28. One input of the differential transconductance amplifier 20, i.e., at a control electrode input (gate) 7 of one of the transistors 27 of the differential transistor pair 27, 28, is the pixel photosignal, either directly from a floating diffusion node (FD as shown in FIGS. 3, 5, 7, and 9-12), or from one or more in-pixel sample stages (e.g., as described in European Patent Publication No. EP2109306 and shown in FIG. 4). FIG. 3 shows an embodiment with a rolling shutter pixel, and FIG. 4 shows an embodiment with a global shutter pixel. The other input 8 of the differential transconductance amplifier 20, (e.g., other gate input of the differential transistor pair) inside the pixel is coupled to reference signal such as a slope or ramp signal 9. At least one of the two differential outputs of the differential transconductance amplifier 20, e.g., at least one power electrode such as a drain 13, 23 of the differential transistor pair 27, 28, is coupled to at least one column output bus 14, 15. For example, two differential outputs of the full differential transconductance amplifier 20, e.g., power electrodes such as drains 13, 23 of the differential transistor pair 27, 28, are coupled to column output busses 14, 15, respectively. These busses 14, 15 can be connected to a column circuit 22 having a column-wise AD current-sensing comparator such as a resistor 16 and column current sense amplifier 17 at the side of the chip. The pixel 1 further contains a bias current source 12 connected to a common power electrode 10 of the differential transconductance amplifier 20, e.g., connected as a common source electrode 10 of the differential transistor pair 27, 28. Depending on the comparison of the voltages applied to the differential transconductance amplifier 20, e.g., the differential transistor pair 27, 28, the bias current will flow through one of the differential outputs 13, 23 (e.g., through one of the two transistors 27, 28 of the differential transistor pair) to end up in one of the two column output busses 14, 15.

Figure 2A:
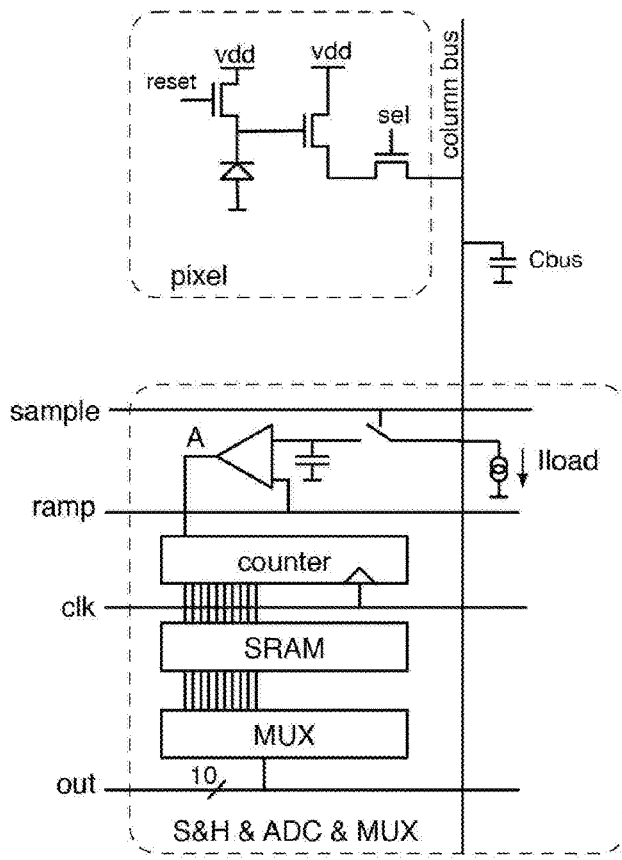
FIG. 2A shows the architecture of a known column ADC stage, including a sample-and-hold stage and a counting ramp AD converter, and FIG. 2B its timing waveforms.
Figure 2B:
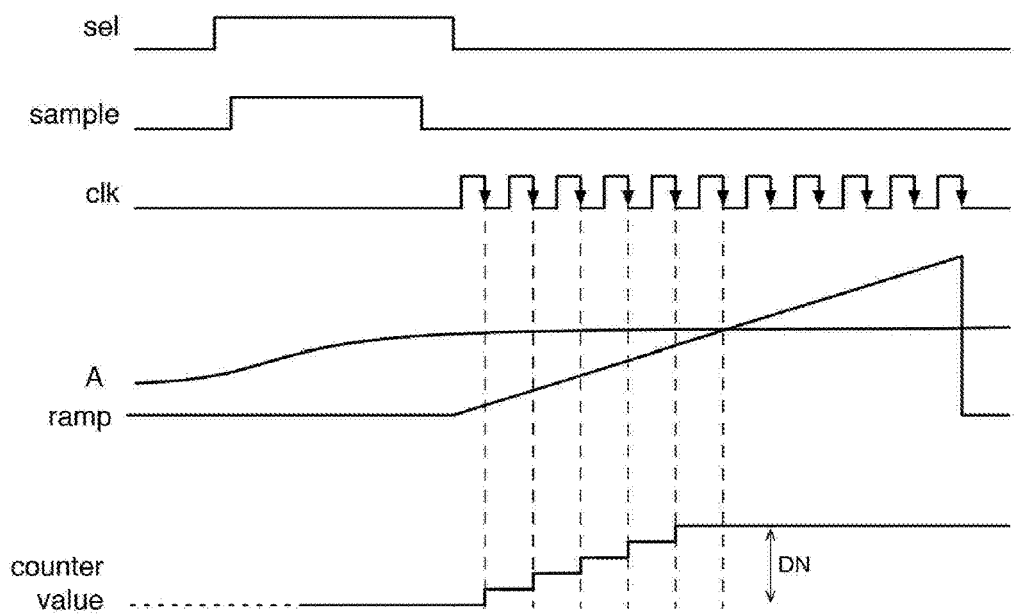

A column circuit 22 comprises means for sensing when the current toggles on the column busses 14, 15, e.g., a column current sense amplifier 17 connected to the column busses 14, 15, e.g., at the side of the pixel array 60 (see FIG. 8) and hence not on the chip including the pixel array. This column current sense amplifier 17 senses the direction of the current, i.e., when it "toggles" from one polarity to the other. This can be done, for example by use of a termination resistor 16 between both busses 14, 15 (as shown in FIG. 3, 6, 7, 10-12), or by two termination resistors 24 to a fixed voltage (as shown in FIG. 4), or by any other means to terminate a fast switching line (e.g., capacitors or capacitive circuits). The direction of the current through the positive out+ (13, 14) and negative out– busses (23, 15) indicates if the applied ramp signal is higher or lower than the pixel signal. This is detected by the column current sense amplifier 17. This current sense amplifier 17 enables or disables one or more counters 19 in the columns (see FIGS. 3, 4, 6, 7, 11, 12). The operation of this counter or these counters 19 can be similar to the operation as described in European Patent Publication No. EP2109223 or U.S. Pat. No. 9,041,581, or FIGS. 2A and B, and serves to convert the signal of the pixel into a digital value, i.e., this is the final step in an AD conversion whereby a part of the AD conversion has been carried out in pixel 1. The counter 19 is driven by a clock 21. The AD processing is sequentially split between processing in the pixel 1 and processing in the column circuit 22. Memory 67, e.g., SRAM, buffers the converted digital value in each column. The SRAM stored data is multiplexed with a digital multiplexer 70 to outputs.

Selection of an active row of a pixel array 60 (see FIG. 8) can be achieved by using the pixel structure of FIG. 3, 4, 6, 7, or 10 to 12 modified to include separate selection switches 26 that are in series with the differential transconductance amplifier 20, for example are switches 26 in each of the differential outputs 13, 23, e.g., of differential transistor pair 27, 28, as shown in FIG. 5. Selection can also (alternatively) be achieved by activating/disabling the bias current source 12 of the differential transconductance amplifier 20, e.g., differential transistor pair 27, 28 as shown in FIGS. 3-7, 9, 10, 12 which is achieved with the "bias+sel" ("bias and selection") control signal 11.

Advantages of embodiments of the present invention are one, some or all of the following advantages (A) through (J):

(A) Settling time of the column busses is smaller.
(B) Current through the column bus will switch direction once the comparator toggles.
(C) Switching of the current is fast, limited by the inductance of the column line, which is small.
(D) Current sensing avoids settling issues.
(E) There is no need to wait for an accurate voltage settling of a column bus (which would be limited by the capacitance of the column bus, which can be high).
(F) The ADC initial ramp voltage for the next AD conversion cycle can be prepared on the next row or rows or set of rows to be converted while the AD conversion runs on the current row(s) that is/are being read out. This preparation can be done in-pixel.
(G) The ADC ramp can then start immediately once the row readout starts.
(H) Optionally, the ramp can already be started already before the AD conversion of the previous row is fully finished, in an "overhead" time-range with signals below the lowest signal expected on the row, to ensure a stable linear operation in the active range of the ramp.
(I) With respect to any of the embodiments of the present invention, the ramp can be reset to its initial value after each AD row conversion. This reset can take substantial time due to the large capacitance of the ramp signal line hence it is an advantage of embodiments of the present invention that this reset can be carried out in a next row or rows while the current row of pixels is being converted.
(J) Lower power: there is no need to settle long column busses; only sensing of the current is required.

Embodiments of the present invention can be adapted to provide on-chip correlated double sampling (or CDS) operation to reduce the readout noise of the pixel. Two signals are sampled and subtracted, one before and one after charge transfer. kTC noise of the first node such as the sense node 6 and any fixed offsets in the readout path are cancelled through this operation. For such CDS operation, two conversion cycles are needed in any ramp-comparator ADC of embodiments of the present invention (see FIG. 12). A first conversion converts the reset level ("reset conversion") and a second conversion converts the signal level ("signal conversion"). The counter(s) 19 controlled by the ADC differential comparator output (differential transconductance amplifier 20, and column circuit 22 make up a differential comparator) is/are enabled at certain phases of the conversion process such that the end value of the counter(s) 19 contains the difference between the signal and reset conversion. This operation is, for example, described in European Patent Publication No. EP 2109223. This can be done with the ADC counter 19 counting in the opposite clock phase, as described in U.S. Pat. No. 9,041,581. The ramp voltage signal 9 needs to be re-initialized in between 2 cycles, which also consumes time. Embodiments of the present invention prepare a second ramp and/or foresee a second differential comparator, e.g., including at least a second differential transconductance amplifier 20, e.g., a second differential transistor pair 27, 28 coupled to the second sample stage to save time. Alternatively the conversion can be interleaved with reset and signal conversions of the next row.

Figure 12A:
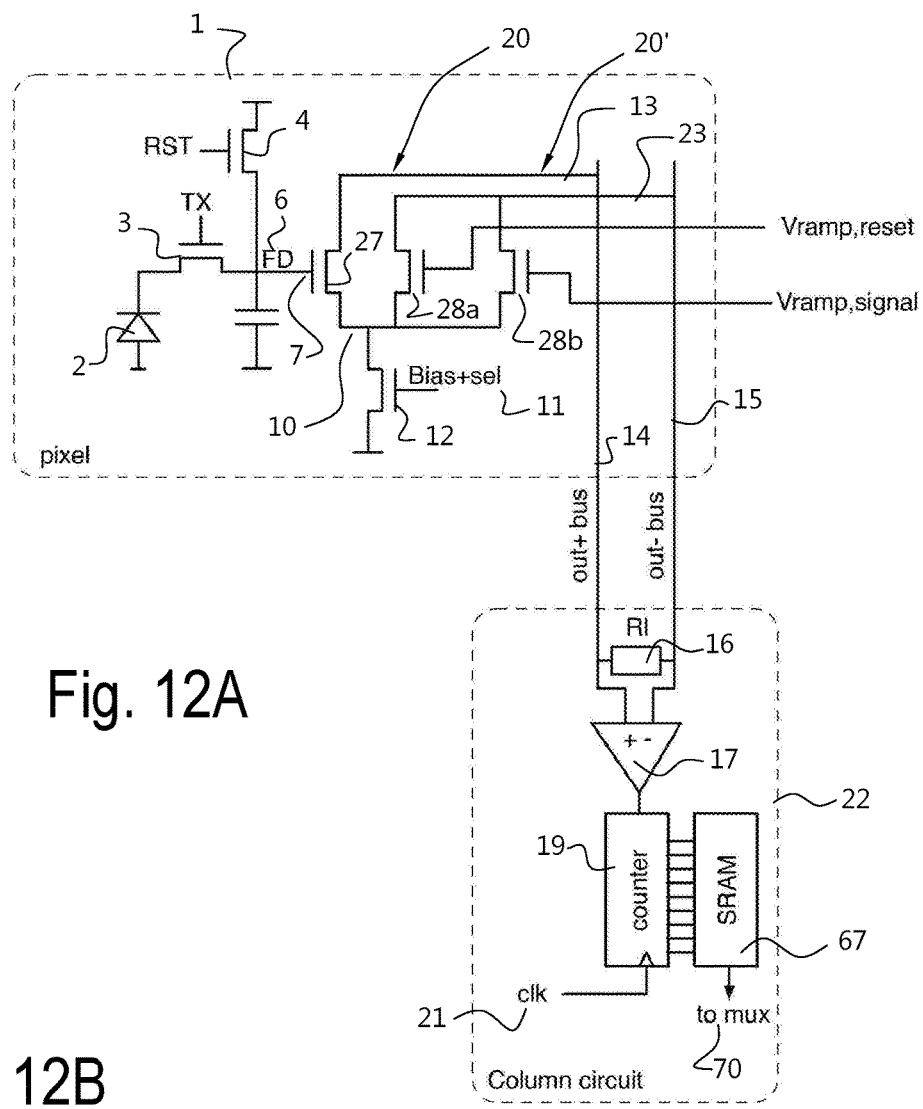
FIG. 12A shows an ADC architecture according to another embodiment of the present invention, with an in-pixel differential amplifier with dual AD conversion cycles, intended to perform correlated double sampling, whereby separate transistors are used for the reset level and signal conversion.
Figure 12B:
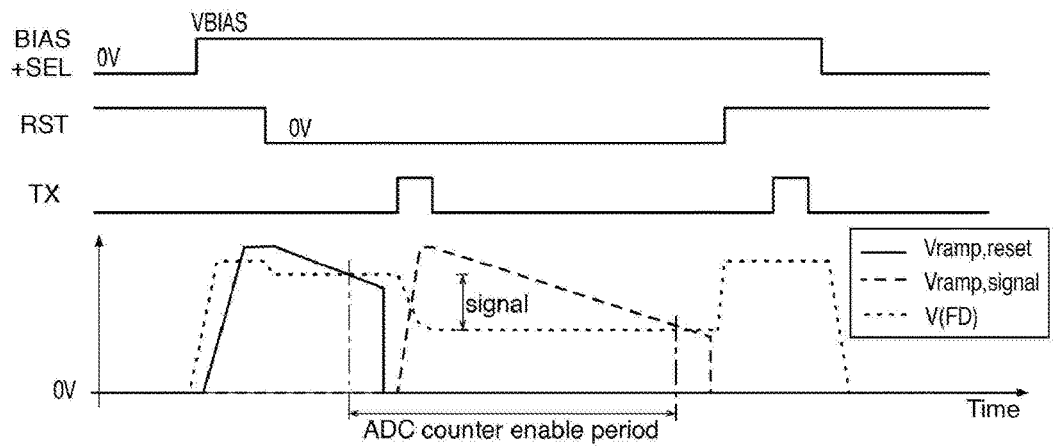
FIG. 12B shows the timing waveforms for the embodiment illustrated in FIG. 11A.

Another embodiment of the present invention uses CDS by duplicating the differential transconductance amplifier 20, e.g., the differential transistors 27, 28a, and 28b that connect to the ramp signal and then providing 2 ramp signals for the two differential transconductance amplifiers 20 and 20'. This is shown in FIG. 12A. Both transistors 28a and 28b share the source node 10 with the other transistor 27 that is connected with its gate 7 to the first node, e.g., the floating diffusion sense node 6. The advantage of this approach is that the time between the end of the reset ramp conversion and the start of the signal ramp conversion can be shortened—see FIG. 12B. A drawback is that mismatch between the transistors is not taken into account.

Architectures where a single and dual slope operation can be done through changes of the control timing of the circuits are included within the scope of this invention. Dual slope operation uses CDS and reduces the temporal and fixed pattern noise of the image. Single slope operation can be used for the fastest frame rate. A CDS mode (with dual slope conversion) provides not only lower read noise, but also can also provide better shutter efficiency for certain global shutter pixels, and better uniformity (PRNU, FPN) at lower frame rate. The CDS subtraction itself may be done off-chip.

FIG. 8 shows a block diagram of an image sensor having an array of pixels 60 making use of an ADC architecture in the pixels as described with respect to any of the embodiments of the present invention relating to a pixel structure or a pixel array. Pixel control signals for charge transfer, reset, selection, bias current and ramp signal are generated at row drivers 62, 64, e.g., located left and/or right of the pixel array 60. The signals of the column busses 14, 15 are sensed by the column sense amplifiers and AD-converted by the counters in the column structure 66. Memory 68, e.g., SRAM, buffers the converted digital value in each column. SRAM data is multiplexed with a digital multiplexer 70 to the outputs 69.

Alternative Embodiments

With reference to FIG. 6, this embodiment also has a pixel structure which comprises photodiode 2, a first node such as a sense node 6, a single stage or multistage differential transconductance amplifier 20 having a first differential control electrode input 7 connected to the first node such as the sense node 6, and a reference signal such as a reference ramp input 9 connected to the other differential control electrode input 8 of the differential transconductance amplifier 20. A bias current source 12 is connected to one power electrode 10 of the differential transconductance amplifier 20. The differential outputs 13, 23 are connected to output busses 14, 15, respectively. In FIG. 6 an in-pixel differential transconductance amplifier 20 is coupled to an in-pixel amplifier such as a transimpedance amplifier. For example, a CTIA (Capacitive TransImpedance Amplifier, also referred to herein as a CTI amplifier) providing in-pixel amplification can be used, with which the charge is transferred onto the feedback capacitor Cfb for charge sensing. The timing sequence at the end of the pixel exposure is as follows: (1) the CTI amplifier is reset by pulsing transistor RST which is a switch that short circuits the feedback capacitor Cfb; (2) the output of the CTI amplifier is sampled on the capacitor Cr by the SR transistor switch; (3) the charge is transferred by pulsing TX, a transistor switch that allows the charge to be transferred from the photosensitive device such as a photodiode onto the feedback capacitance Cfb when transistor TX is conductive; (4) this signal is sampled on capacitor Cs using capacitor Cr.

For readout, first capacitor Cr is read out using the transistor switch RR and applying a ramp signal Vramp 9. Then capacitor Cs is read out in a second conversion cycle by applying again a ramp signal Vramp 9 to the one control electrode 8 of the differential transconductance amplifier 20. The ramp signal used for the signal level (stored on capacitor Cs) can have a wider range than the ramp signal used for the conversion of the reset level (which is stored on capacitor Cr). The counter 19 can again be enabled during different phases of the conversion process for reset and signal conversion.

Figure 9:
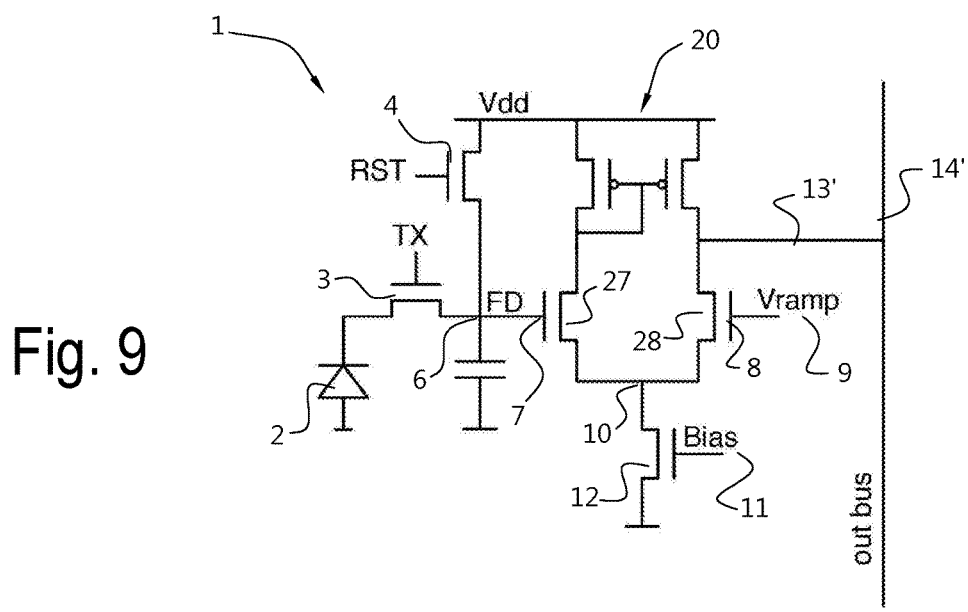
FIG. 9 shows a pixel structure with a single output line in accordance with an embodiment of the present invention.

A further embodiment is shown in FIG. 9. This embodiment also has a pixel structure which comprises photodiode 2, a first node such as a sense node (FD node) 6, a single stage or multistage single-ended differential transconductance amplifier 20 having a first differential control electrode input 7 connected to the first node such as the sense node 6, and a reference ramp input 9 connected to the other differential control electrode input 8 of the single-ended differential transconductance amplifier 20. A bias current source 12 is connected to one power electrode 10 of the single-ended differential transconductance amplifier 20. A single differential output 13' is connected to an output bus 14'. In this embodiment one of the two differential outputs is mirrored, e.g., the output of one of the two transistors 27, 28 of the differential transconductance amplifier 20 is mirrored resulting in a single-ended differential transconductance amplifier. The advantage of this approach is that the pixel has a single column output line 14' but it requires additional transistors inside the pixel as shown in FIG. 9.

In a further embodiment, which can be applied to any or all of the embodiments of the present invention with two column busses 14, 15, the column busses may be connected at the periphery of the chip to a second die using die stacking technology (see, e.g., as described in Sukegawa, et al., "A ¼-inch 8Mpixel Back-Illuminated Stacked CMOS Image Sensor," Proc. IS SCC 2013, pp. 484-485, which is hereby incorporated by reference). In that case, the pixels, including their in-pixel AD differential transconductance amplifier 20 and the column busses 14, 15, are located on a first die, which can be backside illuminated. The means for sensing current such as the column bus sense amplifier 17 and ADC counters 19 are located on the second die. Both dies are connected through die stacking with column-level interconnects at the periphery of the pixel array. Row-level interconnects may be used for distribution of row control signals. Alternatively these row-level signals are generated on the first die. Additional die-to-die interconnects can be present to distribute power, reference voltages and control signals.

In a further embodiment, instead of connecting the differential outputs 13, 23 of the differential transconductance amplifier 20, e.g., the drains of the differential transistor pair 27, 28 to column busses that may be connected to a second die, the differential outputs 13, 23 of the full differential transconductance amplifier 20, e.g., the drains of the transistor pair 27, 28 may be connected directly to a second die by pixel-level die-to-die interconnect technologies (such as for example described in Aoki, et al., "A Rolling-Shutter Distortion-Free 3D Stacked Image Sensor with −160 dB Parasitic Light Sensitivity In-Pixel Storage Node," Proc. ISSCC 2013, which is hereby incorporated by reference). FIG. 7A shows an example of such architecture and 7B a timing chart. The top die 52 is backside illuminated and contains blocks of n×m pixels (e.g., 2×2 pixels). Each block 50 contains a set of pixels 1 of which the outputs are connected to their out+ and out− output busses 14, 15. Each pixel can be according to any of the embodiments of the present invention concerning pixel structure. Each of the pixels 1 within this block 50 is separately selected and read out by multiplexing its signal on the out+ and out− busses 14, 15. For readout of each pixel 1 of the n×m pixel block 50, a ramp conversion cycle is used. The chip is composed of a large amount of n×m pixel blocks 50. Each pixel block 50 contains 2 die-to-die connections to a second die. This second die contains the output bus sense amplifier 17, the counter 19 and clock 21 required for AD conversion, and a memory element 67 to write the result of the AD conversion. The data from the memory 67, e.g., SRAM(S) is multiplexed on this die to a set of digital outputs 70. The top die 52 may be backside illuminated, so that the first and second die face each other and can be connected though die-to-die interconnects. The outputs of the second die 53 are connected by through-silicon vias (TSVs) through the bottom die (or alternatively by TSVs though the top die).

Figure 10:
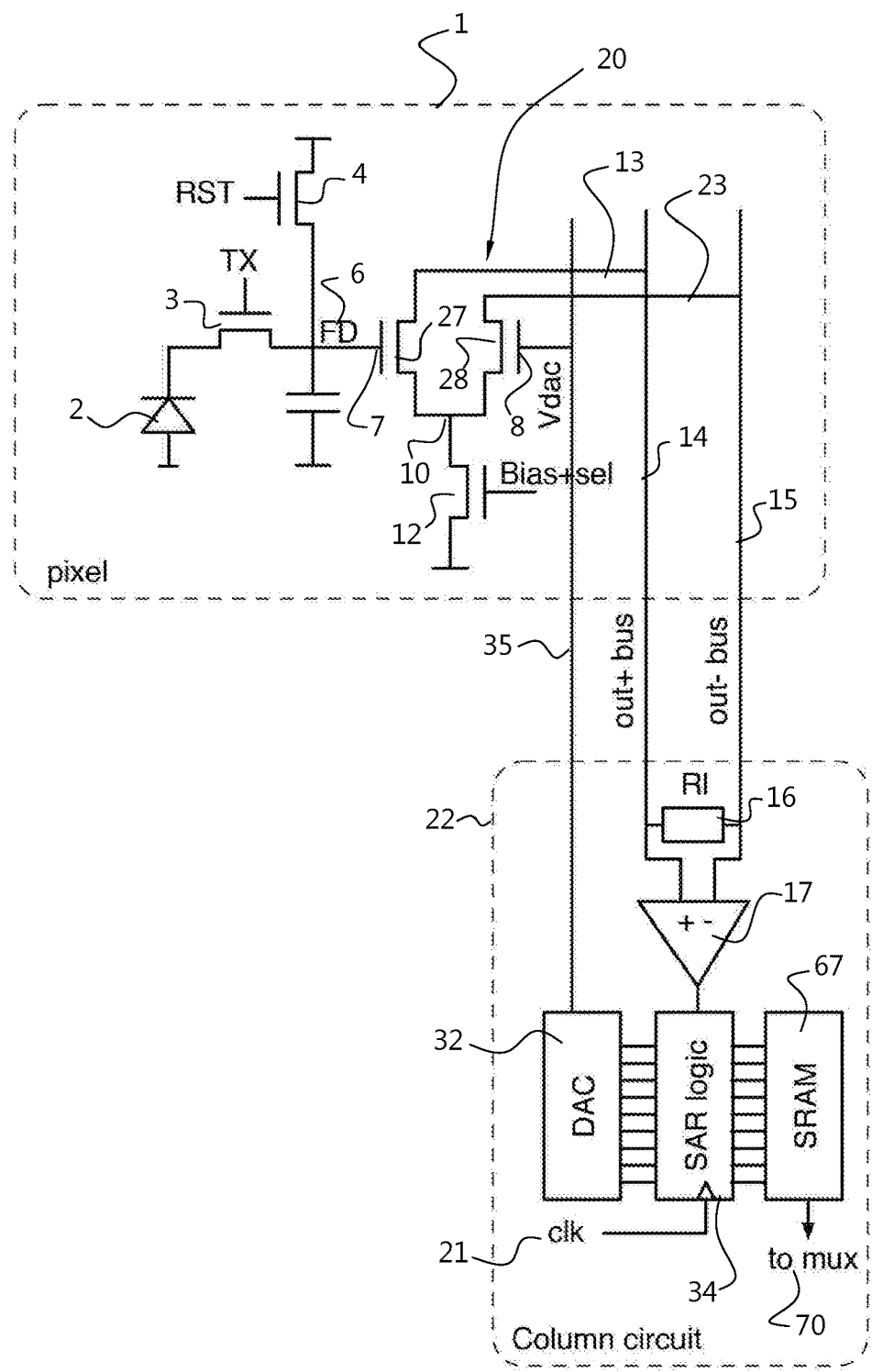
FIG. 10 shows an embodiment of the invention, with an in-pixel differential amplifier where the comparator is part of a successive approximation register (SAR) ADC.

FIG. 10 shows another embodiment of the present invention. In this case, the ADC is of a SAR type as commonly known in the art. This SAR ADC embodiment uses a differential transconductance amplifier 20 that compares the signal to be converted, e.g., on the first node 6, to a reference signal from a DAC 32. For n-bit conversion, typically n conversion cycles are used. For example, the first conversion cycle compares the signal on the first node 6 against the value at a certain value in the range such as in the middle of the ADC range. Depending on the outcome of the comparison, SAR logic 34 decides on the most-significant bit (MSB) and then raises or decreases the value fed into the DAC 32 to a predetermined percentage such as 75% or 25% of the range to determine MSB-1. This continues until the least-significant bit (LSB) is reached. In the SAR ADC a comparator is needed. Again the same comparator type is used as shown in earlier embodiments, where the input differential pair stage of a differential transconductance amplifier 20 and its current bias source 12 is located in the pixel. Other supporting circuitry is put outside of the pixel. Contrary to the ramp ADC architecture described earlier, the reference input to the differential transconductance amplifier 20 (e.g., the differential transistor pair 27, 28) is now provided from a vertical line 35. This vertical line 35 feeds the output of the DAC 32 of the SAR ADC back to the pixel 1. A feedback line 35 for each column is required because during the conversion process, each pixel of the same row will/can converge to a different digital value.

The feedback line 35 can have considerable capacitance, which can slow down the operation of the SAR ADC. On the other hand a SAR ADC can do a single conversion in n clock cycles, while a ramp ADC needs 2^n conversion cycles. For dual conversion, required for correlated double sampling with subtraction of the reset level of the first node such as the floating diffusion node 6 from the photosignal level, dual ADC conversion is required. The large capacitance on the feedback line 35 can still be a problem in case of long interconnect lines or large pixel arrays. The concept of SAR ADCs with an in-pixel differential transconductance amplifier 20 can however also be advantageously ported to a stacked image sensor, similar to the earlier embodiment shown in FIG. 7A.

Figure 11B:
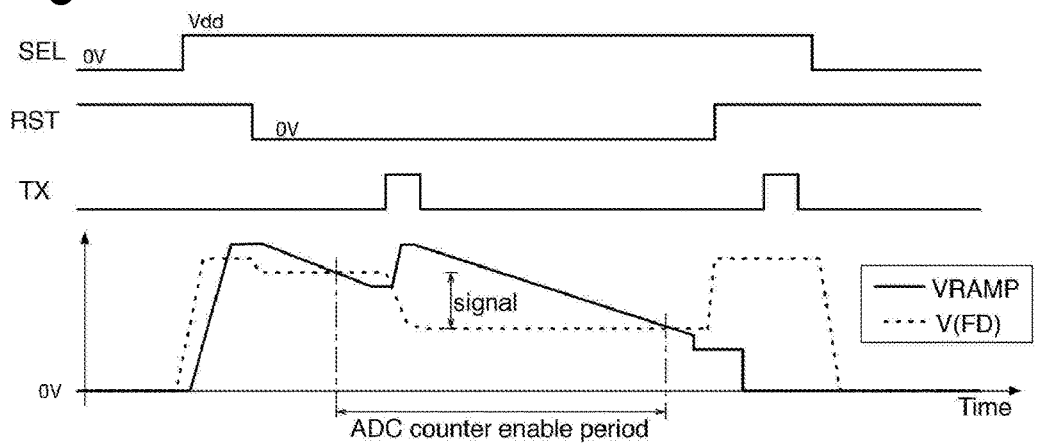
FIG. 11B shows the timing waveforms for the embodiment illustrated in FIG. 11A.

FIG. 11A shows two additional embodiments and FIG. 11B shows a timing chart. Firstly, the pixel bias current source 12 is put in the column logic 22 (i.e., off pixel). In that location, instead of a simple NMOS transistor, a more accurate current source can be used as more space is available away from the pixel. Furthermore, the current source 12 does not need to be switched line-by-line, and a uniform current can be used for all pixels of the pixel array, or all pixels of the same column. This improves the uniformity of the pixel response. This embodiment requires an additional vertical bus 36 over the pixel array. This can be used with backside illumination, since there are ample routing possibilities in a back-illuminated sensor, also known as a backside illumination (BSI) chip. In embodiments using stacked dies, the bias current source 12 can be interconnected by a vertical interconnection to the lower-level die in a similar way as the pixel outputs. Such an embodiment requires however separate selection switches 26 for the pixel, as for example were shown in FIG. 5.

To avoid these extra transistors 26 required to select the pixel, and to save an interconnect line, FIG. 11A and b show another alternative embodiment to select the pixels of a row of the pixel array. The first node such as the floating diffusion node 6 is kept at a low voltage (for example 0V) when the pixel is not read out. The same is done with the other input 8 (reference signal 9) of the differential transconductance amplifier 20 (e.g., the differential transistor pair 27, 28). Only in the row that is read out, different voltages are applied. This is shown in the waveforms of FIG. 11B. This waveform shows the timing for the row that is being read out. Firstly, the row is selected by applying a high voltage on the SEL horizontal line. The RST reset line is high at this moment. The high voltage will also occur on the first node such as the floating diffusion node FD 6. Then the RST reset line is pulsed to a low level (e.g., 0V). After this, the first node such as the floating diffusion node 6 is at its reset reference level. This reference level is converted by applying a high voltage to the VRAMP line, which is gradually decreased during the AD conversion process. At a certain moment the VRAMP ramp voltage becomes lower than the FD reset reference voltage and the comparator, i.e., the differential transconductance amplifier 20 as exemplified by the transistor pair 27, 28, will toggle. After this first conversion cycle, the TX transistor or switch 3 is pulsed and charge is transferred from the photosensitive device such as the photodiode 2 to the first node, e.g., the floating diffusion node FD 6. The first node, e.g., FD node voltage will drop proportionally to the photosignal (see "signal" in FIG. 11). Then the VRAMP voltage is brought to its high level again and a second AD conversion can be started. The differential transconductance amplifier 20 will now toggle when VRAMP crosses the first node, e.g., FD signal level. The time between both togglings of the differential transconductance amplifier 20 can be determined and measured in the column circuits and is proportional to the photosignal. This determination can be done by column-wise counter logics (e.g., resistor 16, amplifier 17, counter 19, clock 21, memory 67 or equivalent) as earlier described.

This principle of selecting and de-selecting the pixel by controlling the FD and VRAMP signal levels can also be applied if the bias current source 12 is inside the pixel.

Alternative Embodiments Using Different ADC Designs

Some of the embodiments of the present invention described above use a ramp-compare type ADC. It is within the scope of the present invention to modify and use different types of ADC in pixel structure 1. For example, in embodiments of the present invention, the differential transconductance amplifiers in different pixels will not use the same reference level for all columns in the next cycle of the conversion.

Embodiments of the present invention may use a SAR ADC. A successive-approximation ADC can use a comparator to successively narrow a range that contains the input voltage. The comparator includes a differential transconductance amplifier 20 in embodiments of the present invention. At each successive step, the converter (i.e., differential transconductance amplifier 20) compares the input voltage, i.e., the signal from the photosensitive device 2 in the pixel 1, to the output of an internal DAC which represents a value of a selected voltage range, i.e., can optionally represent the midpoint of a selected voltage range. At each step in the process, the approximation is stored in a SAR. In embodiments of the present invention the feedback is to differential transconductance amplifiers over a vertical (column line) line rather than a horizontal (row) line, or it can be part of a 2-die stacked imager with interconnects inside the pixel array. In such an embodiment the first comparison can be to the middle of the ADC range. For example, in the next cycle, the pixels which were in the range between mid and full range will be compared against a 75% level, the other pixels will be compared against a 25% level. In such case the reference line cannot be shared amongst the pixels of the row, but it can be applied through a vertical column line. Therefore this can still be done if the reference value supplied to the differential transconductance amplifier 20 comes from a vertical (column) line rather than from a horizontal (row) line. Embodiments of the present invention can use a stacked sensor, e.g., a differential transconductance amplifier on a first die, the rest of the ADC logic on a second die under the pixel or under a small array of pixels, see FIG. 7A.

There are variants of a ramp-compare ADC that are within the scope of the present invention.

For example, parallel ramp cycles can be included by using different ramp voltages to cover different ranges of the analog-to-digital conversion. For example, embodiments of the present invention can use multiple ramp cycles to increase accuracy by running the AD conversion multiple times. Embodiments of the present invention have multiple comparators and multiple ramp distribution lines in the pixel. That takes more area for the pixels but it can be done in larger pixels. Each ADC is divided between a part of the comparator, e.g., an in-pixel differential transconductance amplifier being on the pixel and the remainder (current sense circuitry, memory, multiplexer) being off-pixel in a column circuit.

For example, embodiments of the present invention can use a non-linear or piecewise linear ramp slope. This can be used to use provide bigger conversion steps for larger signals. This can find use with a video signal where the shot noise increases with the square root of the signal so less accurate conversion is needed for large signals. In embodiments of the present invention with this type of ADC a steeper ramp signal is used to convert this part of the range.

For example, embodiments of the present invention can use successive rising and falling ramp cycles. This has the advantage of increasing accuracy by converting the signal and reset levels multiple times.

Embodiments of the present invention can make use of a Wilkinson ADC designed by D. H. Wilkinson. This is similar to the ramp-compare ADC. The Wilkinson ADC is based on the comparison of a signal input voltage with the voltage produced by a charging capacitor. The capacitor is allowed to charge until its voltage is equal to the amplitude of the signal input voltage and a comparator determines when this condition has been reached. Then, the capacitor is allowed to discharge linearly, which produces a ramp voltage. At the point when the capacitor begins to discharge, a gate pulse is initiated. The gate pulse remains on until the capacitor is completely discharged. Thus, the duration of the gate pulse is directly proportional to the amplitude of the input signal. This gate pulse operates as a linear gate which receives pulses from a high-frequency oscillator clock. While the gate is open, a discrete number of clock pulses pass through the linear gate and are counted by an address register. The time the linear gate is open is proportional to the amplitude of the input signal, thus the number of clock pulses recorded in the address register is proportional to the input signal. Alternatively, the charging of the capacitor could be monitored, rather than the discharge. In embodiments of the present invention that use this ADC, the capacitor that is charged should be present in the pixel array as well as dividing the ADC between a part of the comparator, e.g., an in-pixel differential transconductance amplifier being on the pixel and the remainder (current sense circuitry, memory, multiplexer) being off-pixel in a column circuit.

Embodiments of the present invention can make use of a delta-encoded ADC or counter-ramp ADC. This ADC has an up-down counter that feeds a DAC. The input signal and the DAC output both go to a comparator. The comparator controls the counter. The circuit uses negative feedback from the comparator to adjust the counter until the DAC's output is close enough to the input signal. The number is read from the counter. The feedback line that goes to the comparator input has to be a column bus. It will work best in stacked die configuration. A part of the comparator in-pixel is an in-pixel differential transconductance amplifier as described for other embodiments.

In accordance with embodiments of the present invention, an AD converter can combine the delta and successive approximation designs while previous the novel aspect of the present invention such as the in-pixel differential transconductance amplifier.

Embodiments of the present invention can make use of a sigma-delta ADC (also known as a delta-sigma ADC). This ADC oversamples the input signal by a large factor and filters the desired signal band. Generally, a smaller number of bits than required are converted using a Flash ADC after the filter. The resulting signal, along with the error generated by the discrete levels of the Flash, is fed back and subtracted from the input to the filter. This negative feedback has the effect of noise shaping the error due to the Flash ADC so that it does not appear in the desired signal frequencies. A digital filter (decimation filter) follows the ADC, which reduces the sampling rate, filters off unwanted noise signal and increases the resolution of the output (sigma-delta modulation, also called delta-sigma modulation). In an ADC according to an embodiment of the present invention the feedback line goes to the input of a differential transconductance amplifier and the feedback line has to be a column bus. In a sigma-delta converter, this feedback will run at high frequency so a large capacitance on the feedback line has to be avoided. It will work best in a stacked die configuration.

In accordance with any of the embodiments of the present invention a time-interleaved ADC can be implemented with any of the other embodiments of the ADC. For example, it can be combined with a ramp-compare ADC to increase bit depth. Such an ADC uses a plurality of parallel ADCs whereby each ADC samples data every so many cycle of the effective sample clock. The result is that the sample rate is increased compared to what each individual ADC can manage. Each ADC can be any of the embodiments of the present invention and includes a differential transconductance amplifier in-pixel.

Embodiments of the present invention may be implemented on one or more dies, i.e., one or more chips or microchips or integrated circuits as shown schematically in FIG. 7 or FIG. 8.

In the foregoing description and in the accompanying drawings, specific terminology has been set forth to provide a thorough understanding of the disclosed embodiments. In some instances, the terminology or drawings may imply specific details that are not required to practice the invention.

To avoid obscuring the present disclosure unnecessarily, well-known components are shown in block diagram form and/or are not discussed in detail.

Unless otherwise specifically defined herein, all terms are to be given their broadest possible interpretation, including meanings implied from the specification and drawings and meanings understood by those skilled in the art and/or as defined in dictionaries, treatises, etc. As set forth explicitly herein, some terms may not comport with their ordinary or customary meanings.

As used in the written description and the appended claims, the singular forms "a," "an" and "the" do not exclude plural referents unless otherwise specified. The word "or" is to be interpreted as inclusive unless otherwise specified. Thus, the phrase "A or B" is to be interpreted as meaning all of the following: "both A and B," "A but not B," and "B but not A." Any use of "and/or" herein does not mean that the word "or" alone connotes exclusivity.

As used herein, phrases of the form "at least one of A, B, and C," "at least one of A, B, or C," "one or more of A, B, or C," and "one or more of A, B, and C" are interchangeable, and each encompasses all of the following meanings: "A only," "B only," "C only," "A and B but not C," "A and C but not B," "B and C but not A," and "all of A, B, and C."

To the extent that the terms "include(s)," "having," "has," "with," and variants thereof are used in the detailed description or the claims, such terms are intended to be inclusive in a manner similar to the term "comprising," i.e., meaning "including but not limited to." The terms "exemplary" and "embodiment" are used to express examples, not preferences or requirements.

Although specific embodiments have been disclosed, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An image sensor comprising:
    a first die with a pixel array comprising a plurality of pixels, each pixel of the pixel array having a pixel structure comprising:
    a photosensitive device for sensing incident light and for outputting an analog signal,
    a first node for receiving the analog signal,
    a charge transfer transistor coupled to the photosensitive device;
    an in-pixel sampling stage with a first sampling switch coupled to the charge transfer transistor and to a first electrode of a sampling capacitor of the in-pixel sampling stage and a second sampling switch coupled to the first electrode of the sampling capacitor and to the first node; and
    a first in-pixel part of an analog-to-digital converter (ADC) for outputting at least one current signal, the first in-pixel part of the ADC being a differential transconductance amplifier with a first differential input connected to the first node for receiving the analog signal present on the first node, and a second differential input for receiving a reference signal;
    a second die with a second part of the ADC, wherein the first die and the second die are stacked together; and
    at least one output bus connected between the first in-pixel part of the ADC on the first die and the second part of the ADC on the second die,
    wherein the first in-pixel part of the ADC is adapted to output the at least one current signal to the at least one output bus, and
    the second part of the ADC is adapted to receive the at least one current signal and to generate a digital signal, the digital signal being an analog-to-digital conversion of the analog signal.

2. The image sensor according to claim 1, wherein the at least one current signal comprises a first current signal and a second current signal, and the first in-pixel part of the ADC is a full differential transconductance amplifier for outputting the first and second current signals, and the second part of the ADC is adapted to receive the first and second current signals and to generate the digital signal based thereon; or
    the differential transconductance amplifier is single-ended with a single current output.

3. The image sensor according to claim 1, wherein the differential transconductance amplifier is a differential transistor pair.

4. The image sensor according to claim 3, wherein:
    the differential transistor pair comprises a first transistor and a second transistor, wherein:
    a gate of the first transistor is coupled to the first node,
    a control electrode of the second transistor is coupled to the reference signal,
    a common first power electrode of the first and second transistors is connected to a bias current source, and
    a second power electrode of the first or second transistor is coupled to an output bus; or
    the differential transistor pair has two differential outputs, one of the two differential outputs being mirrored, and a single current output of the differential transistor pair is connected to a single column output bus.

5. The image sensor according to claim 3, wherein:
    the at least one output bus comprises a first output bus and a second output bus;
    a second power electrode of the first transistor is coupled to the first output bus; and
    a second power electrode of the second transistor is coupled to the second output bus.

6. The image sensor according to claim 1, wherein a current through the at least one output bus switches direction when the output of the differential transconductance amplifier toggles.

7. The image sensor according to claim 1, wherein the pixel array comprises a plurality of rows of the pixel structures.

8. The image sensor according to claim 7, wherein the reference signal is a ramp voltage supplied by a reference ramp unit, and wherein the array is adapted so that:
    (a) an initial ramp voltage of the reference ramp unit for a next analog-to digital (AD) conversion cycle is prepared on a next row to be converted in-pixel while an AD conversion runs on a row that is currently being read out, or
    (b) the initial ramp voltage starts immediately once a row readout starts, or
    (c) the initial ramp voltage is started for one or more next rows before an AD conversion of a previous row is fully finished, or
    (d) the initial ramp voltage is reset to an initial value after each row conversion.

9. The image sensor according to claim 1, wherein the analog-to-digital conversion is by any of:

a Wilkinson ADC,
a ramp-compare ADC,
a successive approximation ADC,
a delta-encoded ADC,
a sigma-delta ADC,
an interleaved ADC,
on-chip correlated double sampling ADC.

10. The image sensor according to claim 1, wherein the second part of the ADC comprises:
   a counter; and
   a current sense amplifier to sense when a direction of current changes on the at least one output bus and to enable and disable the counter.

11. The image sensor according to claim 1, wherein the first die and the second die are stacked together with wafer-to-wafer stacking or die-to-die bonding.

12. The image sensor according to claim 1, wherein the pixel array comprises blocks of pixels, and wherein a pair of output busses between the first die and the second die is provided for each block of pixels.

13. The image sensor according to claim 12, wherein the blocks of pixels are 2×2 pixels.

14. A method of operating an image sensor comprising a first die with a pixel array, the pixel array comprising a plurality of pixels, each pixel of the pixel array having a pixel structure comprising a photosensitive device, a charge transfer transistor, and a first in-pixel part of an analog-to-digital converter (ADC), wherein the first in-pixel part of the ADC is a differential transconductance amplifier, and the charge transfer transistor is coupled to the photosensitive device and to an in-pixel sampling stage which is connected to the differential transconductance amplifier, the in-pixel sampling stage comprising a first sampling switch coupled to the charge transfer transistor and to a first electrode of a sampling capacitor of the in-pixel sampling stage and to a second sampling switch coupled to the first electrode of the sampling capacitor and to the differential transconductance amplifier, the image sensor further comprising a second die with a second part of the ADC, wherein the first die and the second die are stacked together, the method comprising:
   at the first die, sensing incident light at the photosensitive device and outputting an analog signal;
   at the first die, using the first in-pixel part of the ADC, comparing the analog signal, received from the in-pixel sampling stage, with a reference signal and outputting at least one current signal to at least one output bus; and
   at the second die, receiving the at least one current signal and completing ADC conversion.

15. The method according to claim 14 wherein:
   the second part of the ADC comprises a counter, and
   completing the ADC conversion comprises sensing when a direction of current changes on the at least one output bus and enabling or disabling the counter.

16. An image sensor comprising:
   a pixel array comprising a plurality of pixels, each pixel of the pixel array having a pixel structure comprising:
   a photosensitive device for sensing incident light and for outputting an analog signal,
   a first node for receiving the analog signal,
   a charge transfer transistor coupled to the photosensitive device and to the first node, and
   a first in-pixel part of an analog-to-digital converter (ADC) for outputting at least one current signal, the first in-pixel part of the ADC comprising at least one differential transconductance amplifier with a first differential input connected to the first node for receiving the analog signal present on the first node, and a second differential input for receiving a reference signal;
   a column circuit comprising a second part of the ADC comprising:
   a counter, and
   a current sense amplifier; and
   at least one output bus connected between the first in-pixel part of the ADC and the column circuit,
   wherein the image sensor is adapted to:
   in a first conversion cycle:
   at the first in-pixel part of the ADC, connect a reset voltage to the first node and apply a first ramp signal as the reference signal,
   and
   at the second part of the ADC, sense a first direction of current change on the at least one output bus and enable the counter;
   and
   in a second conversion cycle:
   at the first in-pixel part of the ADC, connect a photo signal voltage to the first node and apply a second ramp signal as the reference signal, and
   at the second part of the ADC, sense a second direction of current change on the at least one output bus and disable the counter;
   and wherein the counter is enabled between sensing the first direction of current change and sensing the second direction of current change, and an amount of time that the counter is enabled is proportional to the photo signal voltage.

17. The image sensor according to claim 16, wherein the first in-pixel part of the ADC comprises:
   a first differential transconductance amplifier, wherein a first differential input of the first differential transconductance amplifier is connected to the first node and a second differential input of the first differential transconductance amplifier is for receiving the first ramp signal; and
   a second differential transconductance amplifier, wherein a first differential input of the second differential transconductance amplifier is connected to the first node and a second differential input of the second differential transconductance amplifier is for receiving the second ramp signal.

18. The image sensor according to claim 16, wherein the first node is one of a charge storage node, a sense node or a node on an in-pixel sample stage.

19. An image sensor comprising:
   a first die with a pixel array comprising a plurality of pixels, each pixel of the pixel array having a pixel structure comprising:
   a photosensitive device for sensing incident light and for outputting an analog signal,
   a first node for receiving the analog signal, and
   a first in-pixel part of an analog-to-digital converter (ADC) for outputting at least one current signal, the first in-pixel part of the ADC being a differential transconductance amplifier with a first differential input connected to the first node for receiving the analog signal present on the first node,
   wherein the differential transconductance amplifier comprises a first, a second and a third transistor, a gate of the first transistor is coupled to the first node, a control electrode of the second transistor is coupled to a reset ramp signal, a control electrode of the third transistor is coupled to a ramp signal, a common first power electrode of the first, second and third transistor is connected to a bias current source, a second power electrode of the first transistor is coupled to a first output bus and a second power electrode of the second transistor and a second power electrode of the third transistor are both coupled to a second output bus;

a second die with a second part of the ADC, wherein the first die and the second die are stacked together; and the first and the second output bus connected between the first in-pixel part of the ADC on the first die and the second part of the ADC on the second die, wherein:

the first in-pixel part of the ADC is adapted to output the at least one current signal to the first and the second output bus, and the second part of the ADC is adapted to receive the at least one current signal and to generate a digital signal, the digital signal being an analog-to-digital conversion of the analog signal.

20. An image sensor comprising:

a pixel array comprising a plurality of pixels, each pixel of the pixel array having a pixel structure comprising:
  a photosensitive device for sensing incident light and for outputting an analog signal,
  a first node for receiving the analog signal, and
  a first in-pixel part of an analog-to-digital converter (ADC) for outputting at least one current signal, the first in-pixel part of the ADC comprising at least one differential transconductance amplifier with a first differential input connected to the first node for receiving the analog signal present on the first node, wherein the differential transconductance amplifier comprises a first, a second and a third transistor, a gate of the first transistor is coupled to the first node, a control electrode of the second transistor is coupled to a reset ramp signal, a control electrode of the third transistor is coupled to a ramp signal, a common first power electrode of the first, second and third transistor is connected to a bias current source, a second power electrode of the first transistor is coupled to a first output bus and a second power electrode of the second transistor and a second power electrode of the third transistor are both coupled to a second output bus;

a column circuit comprising a second part of the ADC comprising:
  a counter, and
  a current sense amplifier; and the first and the second output bus connected between the first in-pixel part of the ADC and the column circuit, wherein the image sensor is adapted to:

in a first conversion cycle:
  at the first in-pixel part of the ADC, connect a reset voltage to the first node and apply the reset ramp signal to the control electrode of the second transistor, and
  at the second part of the ADC, sense a first direction of current change on the first and the second output bus and enable the counter; and in a second conversion cycle:
  at the first in-pixel part of the ADC, connect a photo signal voltage to the first node and apply the ramp signal to the control electrode of the third transistor, and
  at the second part of the ADC, sense a second direction of current change on the first and the second output bus and disable the counter;

and wherein the counter is enabled between sensing the first direction of current change and sensing the second direction of current change, and an amount of time that the counter is enabled is proportional to the photo signal voltage.

21. An image sensor comprising:

a first die with a pixel array comprising a plurality of pixels, each pixel of the pixel array having a pixel structure comprising:
  a photosensitive device for sensing incident light and for outputting an analog signal,
  a first node for receiving the analog signal,
  a charge transfer transistor coupled to the photosensitive device and to the first node, and
  a first in-pixel part of an analog-to-digital converter (ADC) for outputting at least a first and second current signal, the first in-pixel part of the ADC being a differential transconductance amplifier with a first differential input connected to the first node for receiving the analog signal present on the first node, and a second differential input for receiving a reference signal;

a second die with a second part of the ADC, wherein the first die and the second die are stacked together;

at least a first and second output bus connected between the first in-pixel part of the ADC on the first die and the second part of the ADC on the second die, wherein the first in-pixel part of the ADC is adapted to output the at least first and second currents signal to the first and second output bus, and the second part of the ADC comprises a column current sense amplifier connected on its input side to the first and the second output bus and a termination resistor that connects the first output bus to the second output bus and is adapted to receive the at least one current signal and to generate a digital signal, the digital signal being an analog-to-digital conversion of the analog signal.

* * * * *

UNITED STATES PATENT AND TRADEMARK OFFICE
CERTIFICATE OF CORRECTION

PATENT NO. : 10,142,575 B2
APPLICATION NO. : 15/173249
DATED : November 27, 2018
INVENTOR(S) : Guy Meynants It is certified that error appears in the above-identified patent and that said Letters Patent is hereby corrected as shown below:

In the Claims

Column 21, Lines 24-29, Claim 14 should read:
A method of operating an image sensor comprising a first die with a pixel array, the pixel array comprising a plurality of pixels, each pixel of the pixel array having a pixel structure comprising a photosensitive device, a charge transfer transistor, and a first in-pixel part of an analog-to-digital converter (ADC), wherein the first in-pixel part of the ADC is a differential transconductance amplifier, and the charge transfer transistor is coupled to the photosensitive device and to an in-pixel sampling stage which is connected to the differential transconductance amplifier, the in-pixel sampling stage comprising a first sampling switch coupled to the charge transfer transistor and to a first electrode of a sampling capacitor of the in-pixel sampling stage and a second sampling switch coupled to the first electrode of the sampling capacitor and to the differential transconductance amplifier, the image sensor further comprising a second die with a second part of the ADC, wherein the first die and the second die are stacked together, the method comprising:
at the first die, sensing incident light at the photosensitive device and outputting an analog signal;
at the first die, using the first in-pixel part of the ADC, comparing the analog signal, received from the in-pixel sampling stage, with a reference signal and outputting at least one current signal to at least one output bus; and
at the second die, receiving the at least one current signal and completing ADC conversion.

Signed and Sealed this
Tenth Day of September, 2019

Andrei Iancu
*Director of the United States Patent and Trademark Office*